US010148263B2

United States Patent

(12) United States Patent
Coyne et al.

(10) Patent No.: US 10,148,263 B2
(45) Date of Patent: Dec. 4, 2018

(54) COMBINED ISOLATOR AND POWER SWITCH

(71) Applicant: Analog Devices Global Unlimited Company, Hamilton (BM)

(72) Inventors: Edward John Coyne, Galway (IE); Patrick Martin McGuinness, Limerick (IE); William Allan Lane, Waterfall (IE); Laurence O'Sullivan, Limerick (IE)

(73) Assignee: Analog Devices Global Unlimited Company, Hamilton (BM)

( * ) Notice: Subject to any disclaimer, the term of this patent is extended or adjusted under 35 U.S.C. 154(b) by 0 days.

(21) Appl. No.: 15/216,498

(22) Filed: Jul. 21, 2016

(65) Prior Publication Data

US 2017/0279444 A1 Sep. 28, 2017

(30) Foreign Application Priority Data

Mar. 22, 2016 (GB) .................................. 1604796.1

(51) Int. Cl.

*H01L 29/66* (2006.01)
*H03K 17/795* (2006.01)
*H03K 19/003* (2006.01)
*H03K 17/567* (2006.01)
*H01L 27/06* (2006.01)
*H02M 7/217* (2006.01)
*H02M 7/537* (2006.01)

(Continued)

(52) U.S. Cl.

CPC ....... *H03K 17/567* (2013.01); *H01L 27/0623* (2013.01); *H02M 7/217* (2013.01); *H02M 7/537* (2013.01); *H02P 27/06* (2013.01); *H03K 17/06* (2013.01); *H03K 2017/066* (2013.01)

(58) Field of Classification Search

None

See application file for complete search history.

(56) References Cited

U.S. PATENT DOCUMENTS 4,306,145 A * 12/1981 Hill .................... H03K 17/7955 250/214 A
4,688,161 A * 8/1987 Covington ........... H05B 39/042 323/235

(Continued)

FOREIGN PATENT DOCUMENTS

EP 2996246 3/2016
WO WO 01/61951 8/2001

OTHER PUBLICATIONS

Gillot, C., et al., "Wafer Level Thin Film Encapsulation for MEMS," 2005, 4 pages.

(Continued)

*Primary Examiner* — Charles Garber
*Assistant Examiner* — Xiaoming Liu
(74) *Attorney, Agent, or Firm* — Wolf, Greenfield & Sacks, P.C.

(57) ABSTRACT

A combined isolator and power switch is disclosed. Such devices are useful in isolating low voltage components such as control compilers from motors or generators working at high voltages. The combined isolator and power switch includes circuits to transfer internal power from its low voltage side to the switch driver circuits on the high voltage side. The combined isolator and switch is compact and easy to use.

21 Claims, 28 Drawing Sheets

(51) Int. Cl.

| | |
|---|---|
| ***H02P 27/06*** | (2006.01) |
| ***H03K 17/06*** | (2006.01) |

(56) References Cited

U.S. PATENT DOCUMENTS

| | | | | |
|---|---|---|---|---|
| 5,659,190 | A | 8/1997 | Litwin | |
| 6,015,982 | A | 1/2000 | Soderbarg | |
| 8,736,343 | B2 | 5/2014 | Chen et al. | |
| 9,209,091 | B1 | 12/2015 | Harper et al. | |
| 9,653,455 | B1 | 5/2017 | Coyne | |
| 2003/0160281 | A1 | 8/2003 | Chen | |
| 2005/0067630 | A1 | 3/2005 | Zhao | |
| 2008/0191238 | A1* | 8/2008 | Madathil | H01L 29/7397 257/133 |
| 2011/0101417 | A1* | 5/2011 | Ogura | H01L 29/0834 257/139 |
| 2011/0175642 | A1* | 7/2011 | Chen | H01F 17/0006 326/21 |
| 2015/0021682 | A1 | 1/2015 | Bobde et al. | |

OTHER PUBLICATIONS

Vincent, et al., "V-JFET Transistors for over voltage protection in power device series connected applications," Proceedings of the 18$^{th}$ International Symposium on Power Semiconductor Devices & IC's Jun. 4-8, 2006 Naples, Italy, 4 pages.
U.S. Appl. No. 14/937,627, filed Nov. 10, 2015.
U.S. Appl. No. 14/937,705, filed Nov. 10, 2015.
U.S. Appl. No. 14/937,771, filed Nov. 10, 2015.

* cited by examiner

COMBINED ISOLATOR AND POWER SWITCH

CROSS REFERENCE TO RELATED APPLICATIONS

The present application is related to U.S. patent application Ser. No. 14/937,705 and U.S. patent application Ser. No. 14/937,627, both filed 10 Nov. 2015, the teachings of both applications are hereby incorporated by reference herein. This application claims the benefit of GB Patent Application No. 1604796.1 filed 22 Mar. 2016, the entire disclosure of which is hereby incorporated by reference herein.

FIELD OF DISCLOSURE

The present disclosure relates to products comprising a combined isolator and switch.

BACKGROUND

There are occasions where it is desired to control switches that operate in relatively high voltage domains. Many relatively high voltage switches are implemented as semiconductor devices as these are generally more reliable, faster and more compact than mechanical switches. However there is often a call to make sure that hazardous voltages associated with the high voltage switch cannot be propagated along the control path for the high voltage switch.

SUMMARY OF THE DISCLOSURE

In accordance with the teachings of this disclosure, a combined isolator and power switch is provided. The combined isolator and power switch may be provided in a chip (integrated circuit) scale package, either as a single component or in combination with other components within the package. Providing the isolator and power switch in a single package means that the manufacturer can take care ownership of providing signal conditioning or encoding to provide enhanced immunity to false operation due to electrical noise. The manufacturer can also add signal processing capability on the high voltage side of the isolator to decode the information transmitted across the isolator. Such circuitry may include circuits to validate that a message to change the status of the switch is a valid instruction and/or to allow the status of the switch to be interrogated.

In a first aspect of this disclosure there is provided a combined isolator and power switch, comprising: an isolator operatively connected to a signal input node and arranged to supply a control signal to a control node of a semiconductor power switch, the semiconductor power switch being connected between first and second switch nodes, and wherein the semiconductor power switch comprises a bipolar transistor in series combination with a field effect transistor. Advantageously the power switch is inside an isolated region of semiconductor.

Advantageously the isolator is a transformer based isolator, where the coils of the transformer are formed on a substrate, such as a semiconductor or glass substrate, using integrated circuit fabrication techniques. Such isolators are quick and have good isolation capabilities, being able to withstand voltage differences of several KV.

The isolator may be wholly or partially formed on a semiconductor die containing the semiconductor power switch. Alternatively the isolator, or each isolator, may be formed on a die that is different from a die containing the power switch.

Preferably the isolator also includes a transfer arrangement that provides power from a first voltage domain to a second voltage domain. Often, but not necessarily, the first voltage domain can be regarded as a relatively low voltage domain and the second voltage domain can be regarded as a relatively high voltage domain. The relatively low voltage domain may operate at a voltage of a few volts, e.g. 1.8, 3.3 or 5 volts, with respect to a first ground voltage. The relatively high voltage domain may operate is a range of several hundred volts or more, e.g. 115 V, 230 V, 400 V, 800 V, 1200 V, 1800 V as exemplary but non limiting ranges.

The power from the first domain may be used to energize signal processing circuits and to provide a signal to the control node of the power switch.

BRIEF DESCRIPTION OF THE DRAWINGS

Embodiments of devices in accordance with the teachings of the present disclosure will now be described, by way of non-limiting example, with reference to the accompanying figures, in which.

DETAILED DESCRIPTION

Figure 1:
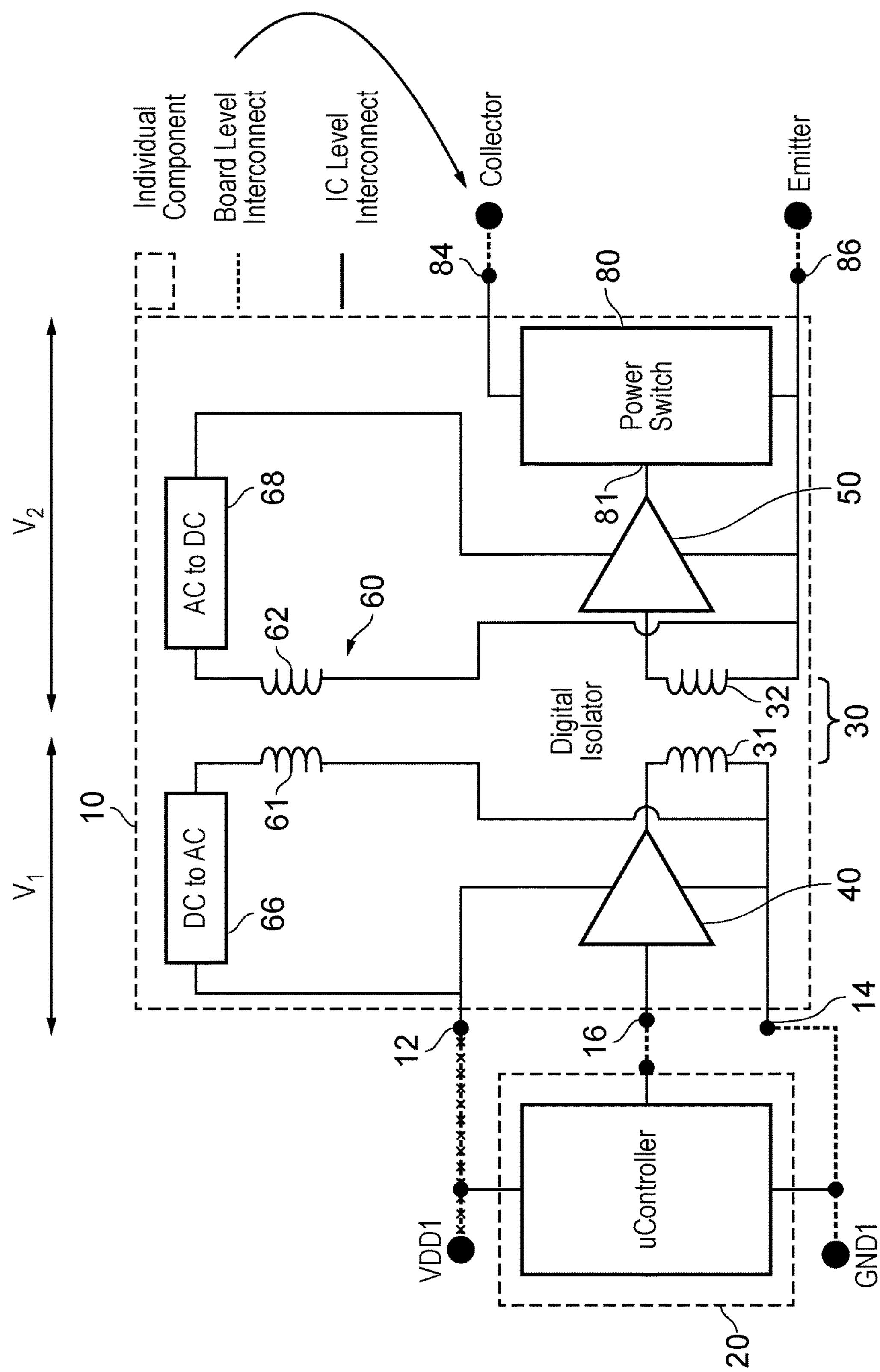
FIG. 1 is a schematic diagram of a combined isolator and power switch is accordance with the teachings of this disclosure.

The following detailed description of certain embodiments presents various descriptions of specific embodiments. However, the innovations described herein can be embodied in a multitude of different ways, for example, as defined and covered by the claims. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Some transistor structures are shown in the figures. Various regions of different doping concentrations and dopant types are shown in the figures and are denoted by boundary lines for diagrammatic convenience. It should be appreciated that due to the doping techniques used the boundaries may be diffuse regions. Furthermore, terms such as "vertical" refer to a device as orientated in the appropriate figure or figures.

FIG. 1 is a circuit diagram showing components of an embodiment of a combined isolator and power switch 10 in accordance with the teachings of this disclosure. The combined isolator and power switch 10 can be provided as a five terminal device, as shown in FIG. 1. The combined isolator and power switch has, in this example, three terminals in a first voltage domain V1 and two terminals in a second voltage domain V2. The terminals in the first voltage domain V1, which in this example is a low voltage domain, comprise a first power supply terminal 12 arranged, in use, to receive a positive supply voltage Vdd1, a second power supply terminal 14 arranged, in use, to be connected to GND (but is could equally have been designated Vss1), and a third terminal 16 which receives a switch control signal. The switch control signal may be provided by a suitable control system, for example as provided by a microcontroller 20.

The microcontroller 20 could be arranged to provide control signals in a form suitable for transmission across an isolator, such as a transformer based isolator 30. Such a signal could be an alternating pattern of 1s and 0s. However it is generally more desirable for the combined isolator and power switch to be configured to be responsive to a switch control signal, which for simplicity could be a signal which is asserted (logic 1) to switch the power switch on and un-asserted (logic 0) to switch the power switch off. Isolators based on a transformer as shown in FIG. 1 or on capacitors (which could be used in place of the transformer 30, and/or in place of the transformer 60) cannot respond adequately to low frequency (DC) voltages and hence it is desirable to include a driver 40 to receive the input signal from the input node 16 and to transform it into a form suitable for driving the isolator. The driver 40 can implement several possible signal processing schemes. For example the driver may implement an oscillator which can be enabled or disabled depending on the state of the control signal so as to implement an on-off keying, OOK, coding scheme. Such an apparatus is disclosed in EP Patent Publication No. 2996246 by YUN RUIDA; SUN YUANJIE; and CHEN BAOXING and owned by Analog Devices Global. Other schemes such as encoding the falling and rising edges of the control signal by distinguishable signals, such as pulses of differing lengths or pulse trains of differing lengths, such as two pulses for a rising edge and one pulse for a falling edge are disclosed in U.S. Pat. No. 8,736,343 owned by Analog Devices, Inc. and incorporated here by reference (and in particular to the teachings of FIGS. 4, 5 and 6 and the associated text where encoding and decoding circuits are described in detail). Other options include the use of multiple transformers to send the on and off signals separately to set and reset nodes of a flip flop (see FIG. 1 of U.S. Pat. No. 8,736,343 as an example), although use of a single transformer for data transmission is preferable as it reduces area used by transformers on the substrate, such as a semiconductor die.

The output of the driver 40 is provided to a primary winding 31 of the micro-transformer 30. Alternating signals at the primary winding 31, such as pulses, set up a magnetic field that couples with a secondary winding 32 of the transformer 30 and provide a signal to an input of a receiver and switch driver 50. The receiver and switch driver 50 receives the encoded signal from the transformer and decodes it to recover the input signal. The encoding and decoding will be explained in greater detail later.

The receiver and switch driver 50 needs some power to operate. To this end a power transfer circuit comprising a second transformer 60 can be provided. A primary winding 61 of the transformer is connected to a DC to AC converter 66 which may be provided in the form of a multi-vibrator/oscillator. A secondary winding 62 of the transformer 60 is connected to an AC to DC converter, for example a diode rectifier and suitably sized storage capacitor to provide DC power to the receiver and switch driver. Voltage regulation components can be provided to control the voltage provided to the receiver and switch driver.

The receiver and switch driver 50 is connected to a control terminal 81 of a power switch 80. Accordingly, the power switch 80 can receive a signal from the isolator 30 at the control terminal 81. Current flow control terminals 84 and 86 form the two terminals of the device in the high voltage domain. In the examples given here the switch technology includes a bipolar device, and hence the terminology used with bipolar devices is appropriate. Therefore terminal 84 can be regarded as a collector of the switch 80 and terminal 86 can be regarded as an emitter.

Figure 2:
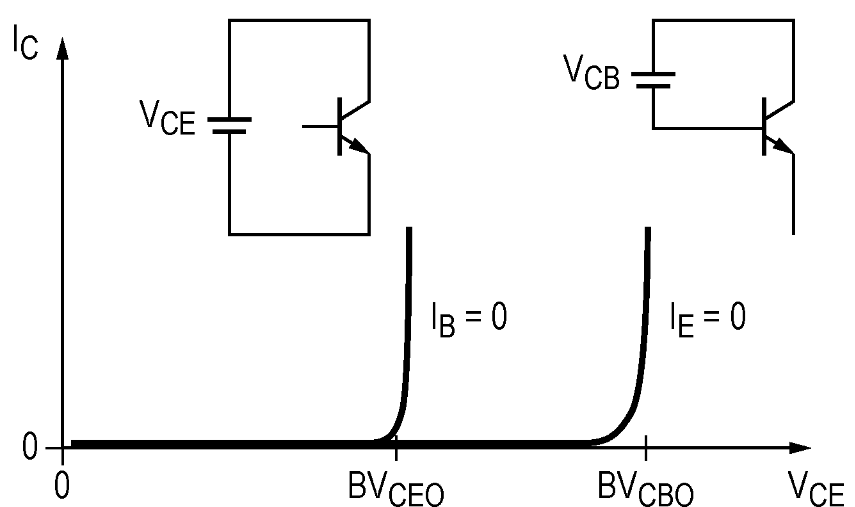
FIG. 2 is a graph illustrating breakdown configurations used to test bipolar transistors.

A problem with bipolar transistors is that the collector-to-emitter current that they pass is related to their base current. It is also known from the literature relating to bipolar transistors that the transistor breakdown voltage BVCEO which is the collector to emitter breakdown voltage with the base open is related to BVCBO, which is the collector to base breakdown voltage of a common emitter transistor with the emitter floating. The relative circuit configurations and breakdown voltages are shown in FIG. 2. The relationship between BVCE0 and BVCBO is given by the following $$BVCEO=BVCBO/(1/\beta)\hat{}(1/m) \qquad \text{Eqn. 1}$$

Where β=current gain and m=4 for NPN and 2 for PNP silicon transistors.

Thus for good breakdown performance a low gain is highly desirable.

In order to address this problem of low current gain a field effect transistor, FET, is provided to drive the base current. The drive FET could be provided as a separate device. However a more compact implementation is to provide the drive FET within the collector region of the bipolar transistor. The driver 50 only has to drive the load presented by the gate of the drive FET rather than supply the current called for by the low gain bipolar transistor. Such a device is known as an insulated gate bipolar transistor, IGBT.

Figure 3:
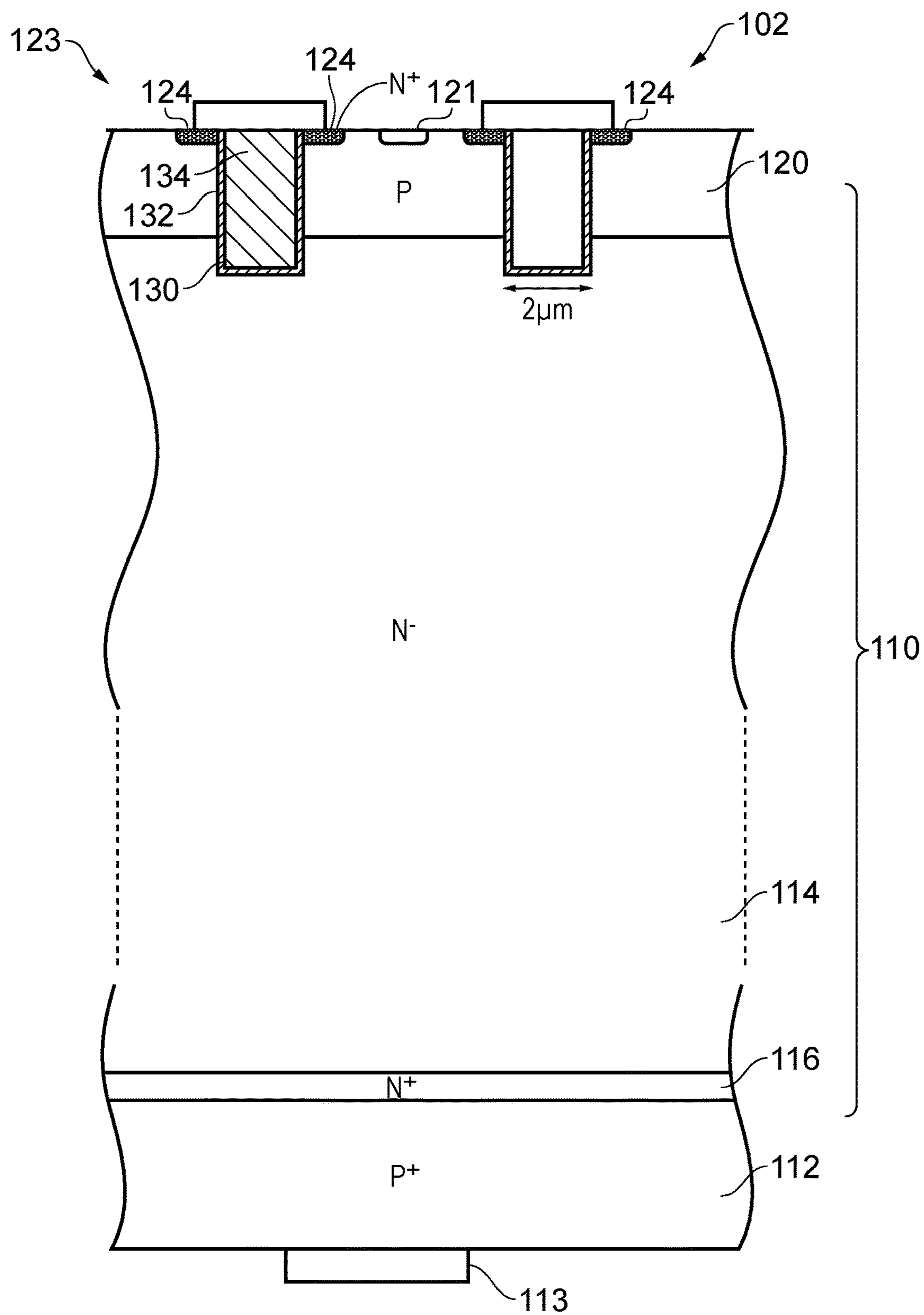
FIG. 3 is a cross section through a prior art insulated gate bipolar transistor

FIG. 3 schematically illustrates the configuration of a prior art vertical IGBT 102. IGBTs can be formed horizontally or vertically. Forming the transistor vertically reduces its footprint on the wafer and hence the cost of the transistor, although this does come with the inconvenience of having to make a contact to the back of the wafer. Horizontal transistors can have all their connections on the surface of the wafer but as a result take up a larger area at the surface of the wafer, and hence are more costly. The transistor shown in FIG. 3 comprises a handle wafer 112 which is P type doped and to which a metal contact 113 is made. An N type region 114 of semiconductor is provided over the P type handle wafer 112. The region 114 is often grown by epitaxial deposition and may be relatively thick, often over 100 microns in high voltage devices. The region 114 is often relatively lightly doped and is designated N− in FIG. 3 whereas the region 112 is quite heavily doped and is designated P+. Often a region 116 is formed between the P+ handle wafer 112 and the N− epitaxial layer 114 and is more highly N type doped that the region 114. This layer 116 helps prevent punch through. A P type region 120 is formed over the N− epitaxial layer 114. Thus the structure is that of a vertical PNP transistor 110. A highly doped P+ region 121 may be provided to facilitate contact between a metal conductor and the P region 120.

The large depth of region 114, which forms the base of the transistor gives the transistor the ability to withstand high potential differences between the layer 112, which forms an emitter and the layer 120 which forms the collector. The maximum voltage that the device can stand scales substantially linearly with the depth of the base layer. However a thick base region also tends to give rise to a low current gain, with the current gain β often being close to unity. Thus the high voltage PNP transistor shown in FIG. 3 has the advantage of being able to act as a switch and withstand high voltages, but the penalty that it incurs is a large base current if it is desired to pass a large collector current.

A drive FET 123 can be provided such that an N type drain region of the FET is formed by the N type region 114 of the bipolar transistor. An N type doping 124 is provided in part of the P type layer 120 so as to form a source terminal of the FET. In order to form a gate, a trench 130 is formed that extends from the surface of the device to the N− layer 114. The trench is lined by a dielectric 132 such as oxide, nitride or polyamide, and the trench is then filled with a conductive material 34 to form a gate electrode. The conductive material may, for example, be a metal or doped polysilicon.

The regions 124 are in contact with the material 120 forming the collector of the PNP transistor and can take current from the surface of layer 120 and, by virtue of the voltage of the gate depleting the P type material adjacent the insulator 132 and thereby forming a N type channel adjacent the insulator 132, current can be supplied to the base region to turn the bipolar transistor on.

However the IGBT shown in FIG. 3 still suffers from the fact that the drive FET 123 should be relatively sizable to supply the large base current as the current gain of the bipolar transistor is close to unity. As a result the drive FET of the IGBT has a relatively large gate, which in turn has a relatively large gate capacitance. A consequence of this is that to switch the IGBT on and off quickly (as can be highly desirable to save it spending time in a high power dissipation regime where it is passing a large current while being exposed to a large voltage drop) then the gate inrush current may still reach several Amperes, albeit for a short duration. Lower current give rise to slower switching times.

In order to reduce the gate drive current it would be desirable to reduce the gate capacitance. This can be done by making the drive FET smaller, but in turn this can reduce the current that can be supplied to the base of the bipolar transistor. The bipolar transistor base current could be reduced by increasing its current gain, but this can cause the break-down voltage to plunge. Thus the IGBT designer is faced with trading off gate current against breakdown voltage.

This large gate capacitance means that the drive circuit 50 should be able to source and sink a substantial current which in turn means that an additional non-integrated transformer should be provided as part of the power supply generation for the driver 50. The current for such a transformer is too large to enable the transformer to be miniaturized sufficiently to bring it within a chip scale package and certainly too big for the transformer to be fabricated using integrated circuit fabrication techniques.

However one of the inventors realized that it is possible to inject carriers into a fully depleted region of semiconductor. This counter intuitive observation lead the inventor to develop a device where a bipolar transistor structure is modified to have a fully depleted region within it when it is in an off (non-conducting) state. In effect a series connected FET is provided which serves to limit the voltage that occurs across the bipolar transistor. This in turn allows a higher gain transistor to be used, with the result that the base current that the drive FET has to sustain is reduced, and hence the drive FET can be smaller, and consequently its gate capacitance can be reduced making the device easier to drive. An alternative, but equally valid way of looking at the new switch device is to regard it as a depletion mode FET where the source region has a doped insertion of an opposite type of doping to the FET. Thus, in an N channel FET, a P type layer is inserted into the channel, the layer cooperating with the N doped regions to form a NPN transistor with the highly doped source region.

It is common when dealing with transistor structures, such as field effect transistors to regard a fully depleted region as not supporting conduction because, for example, use of depleting the channel of a FET is made to turn the device off so as to inhibit current flow between its drain and source regions. However the inventor realized that it would be possible to bias a FET into pinch off so as to drop a large voltage across the FET but still be able to inject carriers into the depleted region such that current could flow through the device could be initiated. Furthermore the current flow as a result of the carriers causes the FET to turn on such that it no longer drops a large voltage across the region of semiconductor that previously had been depleted, and hence the device is not subject to relatively large amounts of power dissipation because the effective on resistance RON of the device becomes relatively small.

In an embodiment of the present disclosure a FET is formed in series with a bipolar transistor, in such a way that the collector of the bipolar transistor opens into the channel region of the FET. This FET can be considered as a voltage dropping FET as it can reduce the voltage seen by the bipolar transistor from the supply voltage to a pinch off voltage for the voltage dropping FET. The bipolar transistor can either be driven as if the device as a whole was a bipolar transistor, or alternatively the bipolar transistor can still be associated with an input/drive FET arranged to provide the base current for the bipolar transistor. This approach also allows the bipolar transistor to be fabricated with more current gain, and hence the drive requirements of the bipolar transistor are reduced. This in turn allows the size of the FET part of the IGBT like device to be reduced. This in turn reduces the current demanded form the driver 50 and as a consequence it becomes possible to reduce the size of the transformer 60 in the power transfer circuit to the extent that the transformer 60 can be formed using lithographic and etching techniques used in semiconductor device fabrication. The formation of the IGBT like devices that form the power switch 80 will be considered in greater detail later. However for completeness an example of circuits used in the signal encoder 40 and the receiver 50 will now be discussed.

Figure 4:
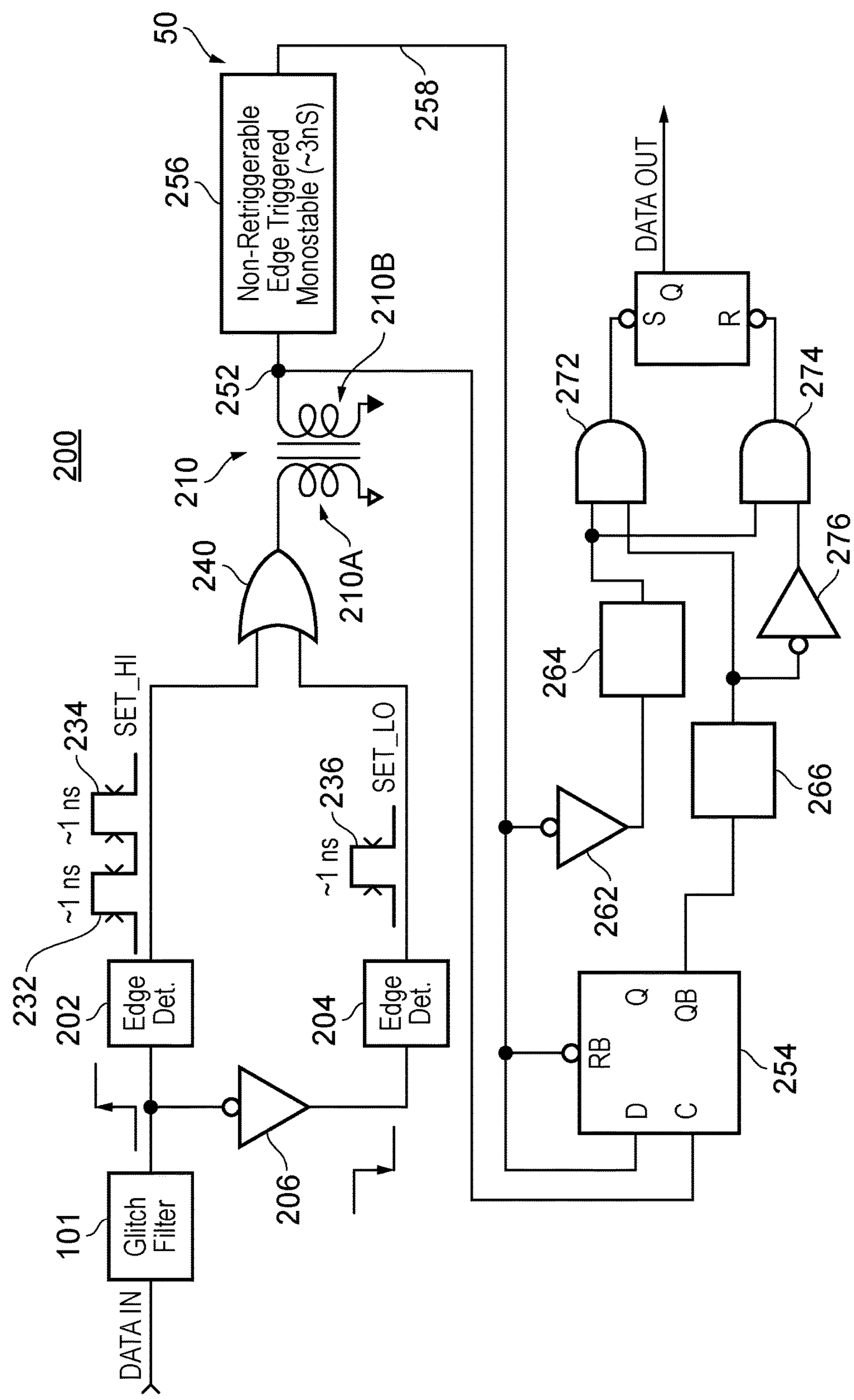
FIG. 4 is an extract from U.S. Pat. No. 8,736,343 for the purposes of illustrating a transmitter and receiver arrangement on either side of a micro-transformer.

FIG. 4 illustrates a logic signal isolator 200 in which encoded leading and falling edge indicators from a pair of edge detectors 202 and 204 are sent to a single transformer 210 used for data transmission. The leading edge and falling edge indicators are encoded as different, distinguishable signals. That is, a SET_HI signal output from leading edge detector 202 is distinct from a SET_LO signal output from falling edge detector 204. The receiving side circuitry connected to the secondary winding 210B of transformer 210 (typically via a Schmitt trigger or other suitable wave-shaping circuit, not show) then reconstructs the logic edges based on distinguishing between those two signals.

An example is illustrated wherein edge detector 202 produces two consecutive short pulses 232 and 234 as a leading edge indicator and edge detector 204 produces only a single pulse 236 as a falling edge indicator. The pulses 232 and 234 preferably have a known, fixed spacing between them. If transformer 210 is a high bandwidth micro-transformer, the pulse widths may be as narrow as 1 ns or even less. The outputs of edge detectors 202 and 204 are combined, for example by an OR gate 240, to drive the primary winding 210A of the transformer.

The concept is to use two different, distinguishable signals. They need not be a single pulse and a double pulse. For example, a narrow pulse (e.g., 1 ns) could be used as one edge indicator and a wider pulse (e.g., 2 ns) could be used as the other edge indicator. It may be sufficient that the receiver 50 be able to distinguish the two signals. The concept lends itself to the use of other distinguishable signals but at the same time, one would not wish to use an unnecessarily complicated arrangement or one which would add any significant delay in signal processing. For signals other than those illustrated, the OR gate 240 may be replaced with other elements that would effectively combine the outputs of the edge detectors into a single signal for driving the transformer.

The two pulses in the SET_HI signal have a known, fixed spacing between them. The total duration of the two pulses and the intervening gap between them in the SET-HI signal, if sufficiently short with respect to the shortest interval between two leading edges in the input signal, will permit resolution between the SET-HI and SET_LO pulses.

A receiver circuit 50, connected to secondary winding 210B, recovers the output of transformer 210, distinguishes between the SET_HI and SET_LO pulses, and reconstructs the input logic signal as a data out signal. More specifically, the received pulses at node 252 clock a D-type flip-flop 254 and also act as the input to a non-retriggerable edge-triggered mono-stable multi-vibrator 256. The multi-vibrator 256 puts out a pulse on line 258 that is of duration at least as long as the combination of pulse 232 and the interval between pulse 232 and pulse 234 in the SET_HI signal. If the two pulses 232 and 234 are each approximately 1 ns in duration and the interval between them is of like duration, then the pulse on line 258 should be at least about 2 ns long; 3 ns is used in this example to allow some "hold" time to facilitate clocking of flip-flop 254. Line 258 connects to the D input of flip-flop 254, to the reset input of that flip-flop and to the input of inverter 262. The output of inverter 262 is connected to the input of an edge detector 264 and the QB output (the complementary output) of flip-flop 254 is connected to the input of another edge detector 266. The output of edge detector 264 is connected to one input of each of AND gates 272 and 274. The output of edge detector 266 is connected to the second input of AND gate 272 and through inverter 276 to the second input of AND gate 274. In turn, the output of AND gate 272 is connected to the set input of set/reset flip-flop 278 and the output of AND gate 274 is connected to the reset input of flip-flop 278. The DATA OUT signal, corresponding to an isolated and slightly delayed version of the DATA IN signal received by the glitch filter, appears at the Q output of flip-flop 278.

Figure 5:
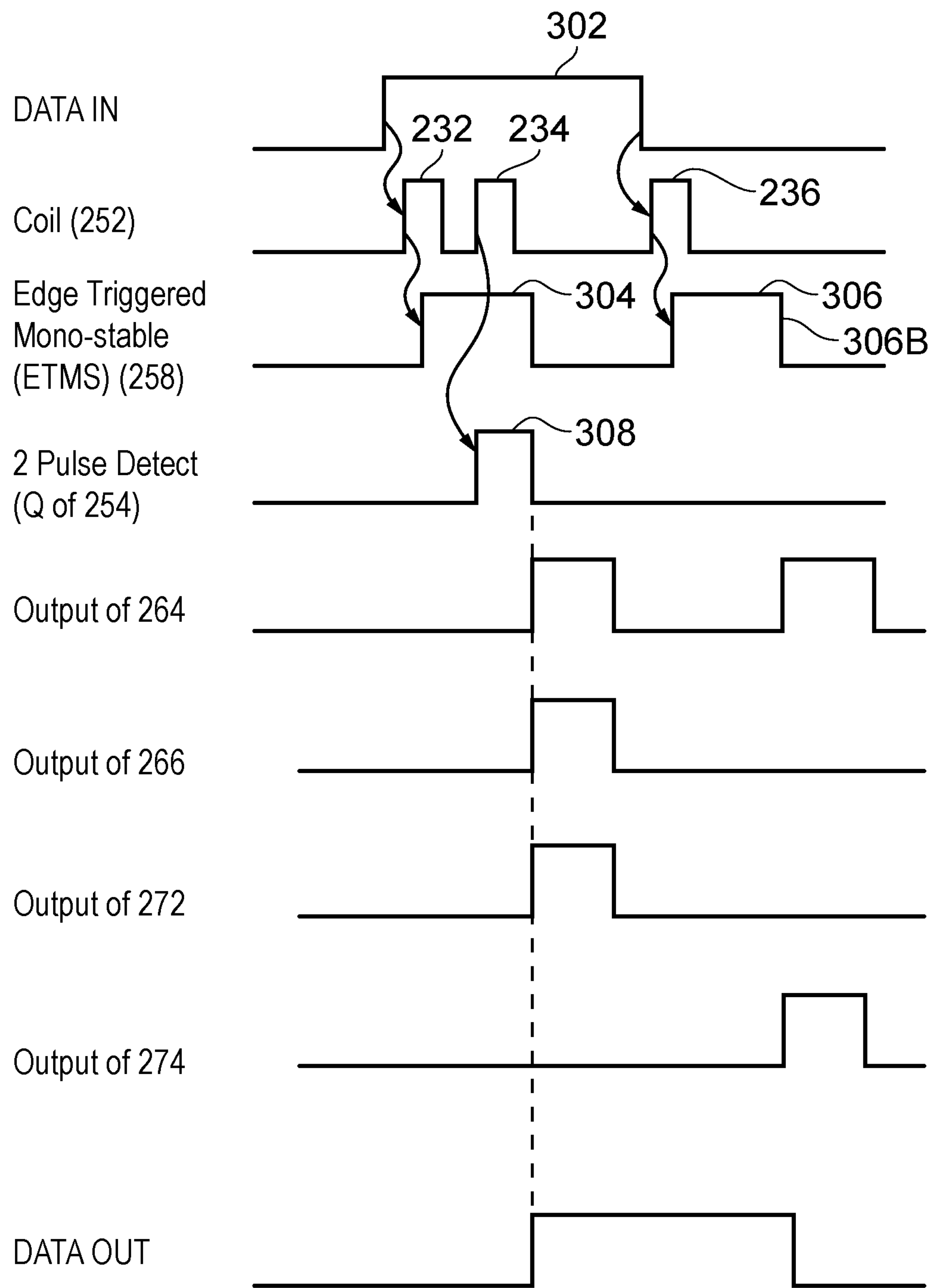
FIG. 5 is a timing diagram to show selected waveforms in the circuit of FIG. 4.

The operation of this circuit will now be explained with reference to the waveforms of FIG. 5. Assume that the DATA IN input has the waveform 302. At node 252, the COIL signal is received. Pulses 232 and 234 have been generated by edge detector 202 in response to the leading, positive-going edge of the input signal and pulse 236 has been generated by edge detector 204 in response to the negative-going, trailing edge of the input signal. The edge-triggered mono-stable (ETMS) multi-vibrator 256 generates an output waveform on line 258 as shown at ETMS. In the ETMS signal, the leading edge of pulse 232 causes the pulse 304 to be generated. The multi-vibrator 256 does not do anything in response to the falling edge of pulse 232 or to either edge of the second pulse 234. Only after pulse 304 has been output is the multi-vibrator 256 able to respond to a new input, which it does when it receives the leading edge of pulse 236. Detection of the leading edge of pulse 236 causes the outputting of pulse 306.

The second of the two initial pulses, pulse 234, is detected and the output signal is formed as follows. When the first pulse 232 clocks the flip-flop 254, the D input of the flip-flop still sees a low output from the edge-triggered mono-stable multi-vibrator on line 258. That means the QB output of the flip-flop 254 is set to a high value and the Q output is set to a low value. When the second pulse 234 is received and clocks flip-flop 254, the output of the edge-triggered mono-stable is now high and the QB output of flip-flop 254 transitions to a low value, meaning that the Q output of flip-flop 254 goes high as at the leading edge of the pulse 308 in the "2 Pulse Detect" signal on FIG. 5. This H-L edge is sensed by edge detector 266, which produces a pulse 310 to the second (bottom) input of AND gate 272. The output of the edge-triggered mono-stable is also supplied to the input of inverter 262. So, after the propagation delay through inverter 262, edge detector 264 sees a high-to-low transition (edge) at the output of inverter 262 and responsively generates a positive-going pulse 312 to the first (top) input of AND gate 272 and to a first (top) input of AND gate 274. Inverter 262 is designed to have a propagation delay that is substantially equal to that from the D input to the QB output of flip-flop 254. Hence, edge detectors 264 and 266 produce substantially concurrent output pulses 310 and 312 to AND gate 272. As a result, the output 314 of AND gate 272 goes from low to high at the same time and sets the set (S) input of the SR flip-flop 278; and the Q output thereof, being the DATA OUT signal, goes high. As the second (bottom) input of AND gate 274 is responsive to the output of edge detector 266 through inverter 276, the first and second pulses have no impact on the output of AND gate 274 and do not affect the output of flip-flop 278. However, when third pulse 236 triggers edge-triggered mono-stable 256, to produce its second output pulse 306, this results as stated above, in the generation of a pulse at the output of edge detector 264 upon the falling edge of the mono-stable output pulse. The second input of AND gate 274 from inverter 276 will be high at this time because the only time it is low is when the output of edge detector 266 generates the second pulse detection signal 308. Therefore, the reset (R) input of flip-flop 278 sees the output pulse 316 from AND gate 274 upon the falling edge of the output pulse from edge detector 264 (plus propagation delay), and flip-flop 278 is reset and the DATA OUT signal goes low.

Figure 6:
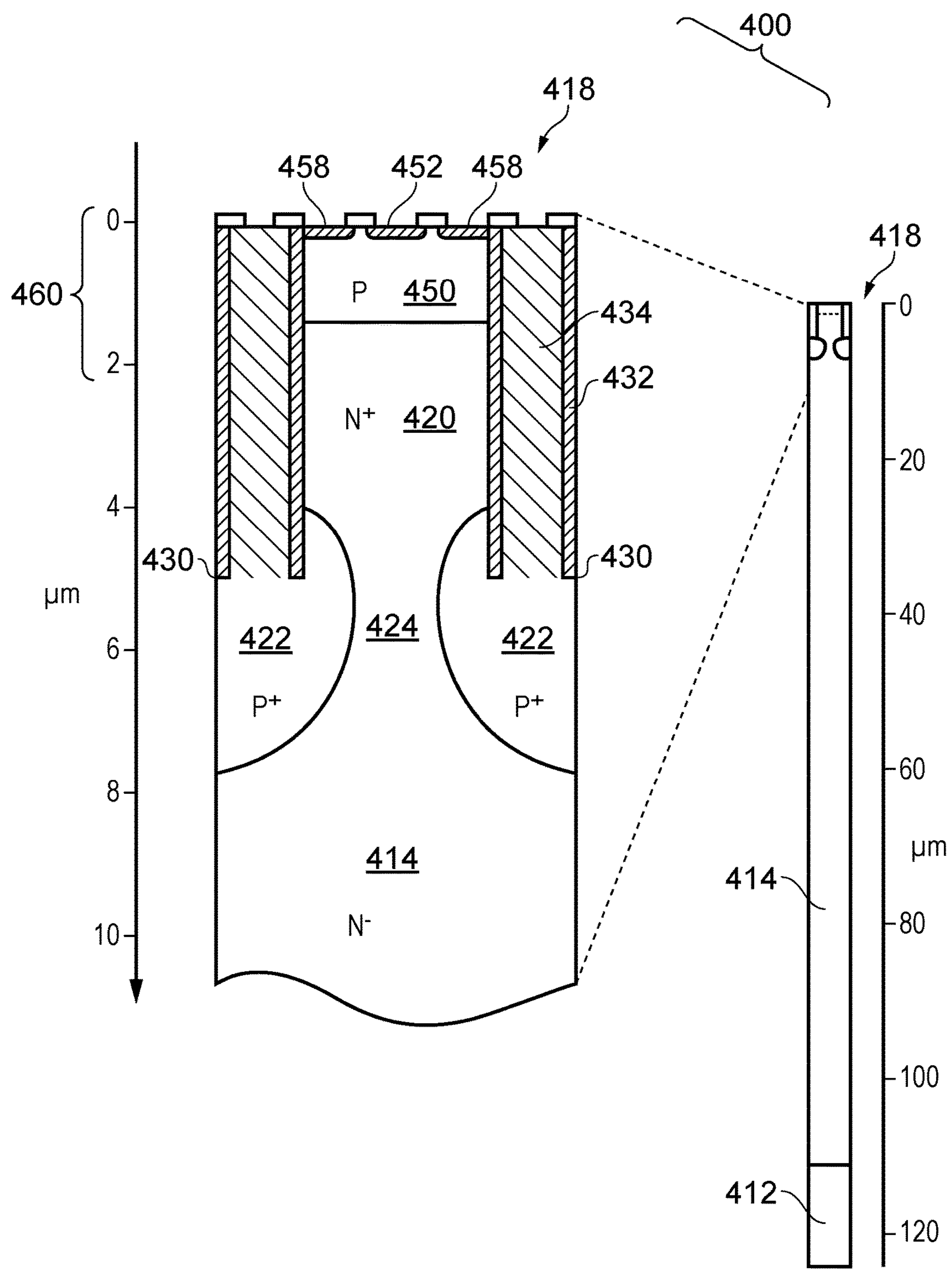
FIG. 6 is a cross section through a first embodiment of a power switch transistor.

FIG. 6 is a cross section through an active portion of a device fabricated in accordance with this disclosure. The device, generally designated 400, forms a semiconductor switch and can behave as if it was an IGBT if an input/drive FET is provided, otherwise it can function like a relatively high voltage bipolar transistor with a relatively high gain. The device 400 has, in this example, been formed as a vertical device as this is an efficient way of forming a high voltage switch because the depth of the wafer can be used to set the breakdown voltage of the device 400. Thus a first layer 412 can be reasonably heavily doped, for example in the range of $10^{18}$ impurities per cubic centimeter, to form a contact region which can look as if it forms a collector of the IGBT or bipolar transistor like device 400. A layer 414 is grown over the first layer 412. This may be grown as an epitaxial layer, and in this example is an N type region that can be much like the N− region 114 that was described with respect to FIG. 3. The region 414 may be many microns thick, and in this example is about 112 microns thick so as to provide a device able to safely operate as a switch at 1200 Volts. Wafers having the configuration described so far are commercially available. An uppermost region 418 of the device is shown in expanded form in FIG. 6 but without the contacts to the semiconductor regions being shown, although gaps in the insulating layer though which the contacts extend are illustrated. The layer 414 is more lightly doped that the first layer 412, for example with a doping concentration of about $10^{13}$ donors per cubic centimeter. Layer 414 can be regarded as forming a voltage dropping region of an extended channel of a FET. Increasing the thickness of layer 414 can increase the maximum voltage the device can withstand while making the layer 414 thinner can reduce the maximum voltage.

As shown in FIG. 6, the region 418 can extend about 10 microns below a top surface of the device 400 and the device 400 and the layer 412 can be more than 100 microns below the top surface of the device 400.

An N type layer 420 is formed within the region defined (for example enclosed or encircled) by trenches 430 that are lined with a dielectric material 432 and which enclose a conductor 434 in a way which is analogous to the structures 130, 132 and 134 described with respect to FIG. 3. However, comparing FIG. 6 to FIG. 3, it can be seen that the doped region 420 above the N type epitaxial layer 414 is new.

Another feature of the device 400 shown in FIG. 6 is the formation of, in this example, P type buried regions 422 beneath and in contact with open end portions of the insulated trenches 430. The P type layers 422 can effectively form a relatively narrow channel 424 connecting the N+ region 420 to the epitaxial N type region 414. The conductive material 434 within the insulated trenches 430 can effectively act as a conductor to a gate terminal of a FET whose channel 424 extends between region 420 and region 414. The size of the regions 422 and acceptor concentration deposited in a buried layer used to form the regions 422 and/or donor concentration in the channel 424 can be varied to control the voltage that region 412 and hence region 414 should be at compared to the gate voltage of the gate material 434 to cause the N type channel region 424 between the P type regions 422 to become depleted and hence limit the potential at the N+ region 420. A P type region 450 is formed over the N+ region 420 and a relatively highly doped N+ region 452 is formed with the region 450. The regions 420, 450 and 452 cooperate to form a vertical NPN transistor 460.

This is another difference from the structure described with respect to FIG. 3 where a low gain PNP transistor 110 was formed throughout the body of the device. The base of the NPN transistor 460 in FIG. 6 is significantly thinner than the base of the PNP transistor in FIG. 3, and this can give rise to higher gain, a higher frequency response but a lower break down voltage. As illustrated in FIG. 6, the base region 450 has a thickness of less than 2 microns. In other implementations, the base can have a thickness of less than 5 microns or less than 10 microns.

Figure 7:
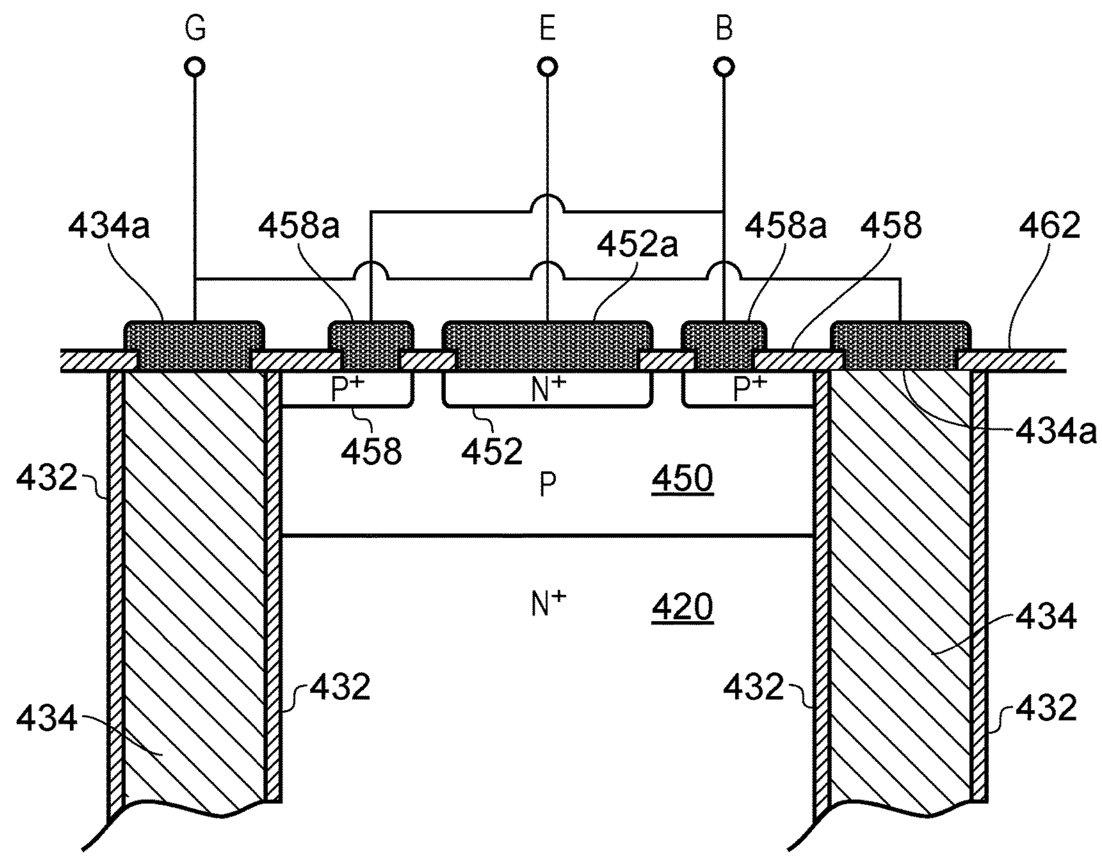
FIG. 7 is a cross section an upper part of the transistor shown in FIG. 6.

If the device shown in FIG. 6 is to be used as a high voltage NPN transistor, then a metallic contact **452*a* can be made to the emitter region 452, and a metallic contact 458*a* can be made to the base region 450 by way of the relatively highly doped region 458, as shown in FIG. 7. In such an arrangement a further metal contact 434*a* can also be made to the conductive material 434 that can control the voltage of regions 422 (FIG. 6). As shown in FIG. 7, the metallic contacts 434*a*, 452*a* and 458*a* extend through apertures formed in a dielectric layer 462, such as an oxide layer. The formation of such a structure is within the knowledge of the person skilled in the art and is offered within the standard silicon or complementary metal oxide semiconductor (CMOS) process of many transistor fabrication facilities. For convenience the regions 434 and contacts 434*a* can be connected to the emitter contact 452*a*. The device of FIG. 7** may be formed on a die with a drive transistor located elsewhere on the die so as to emulate IGBT functionality.

Figure 8:
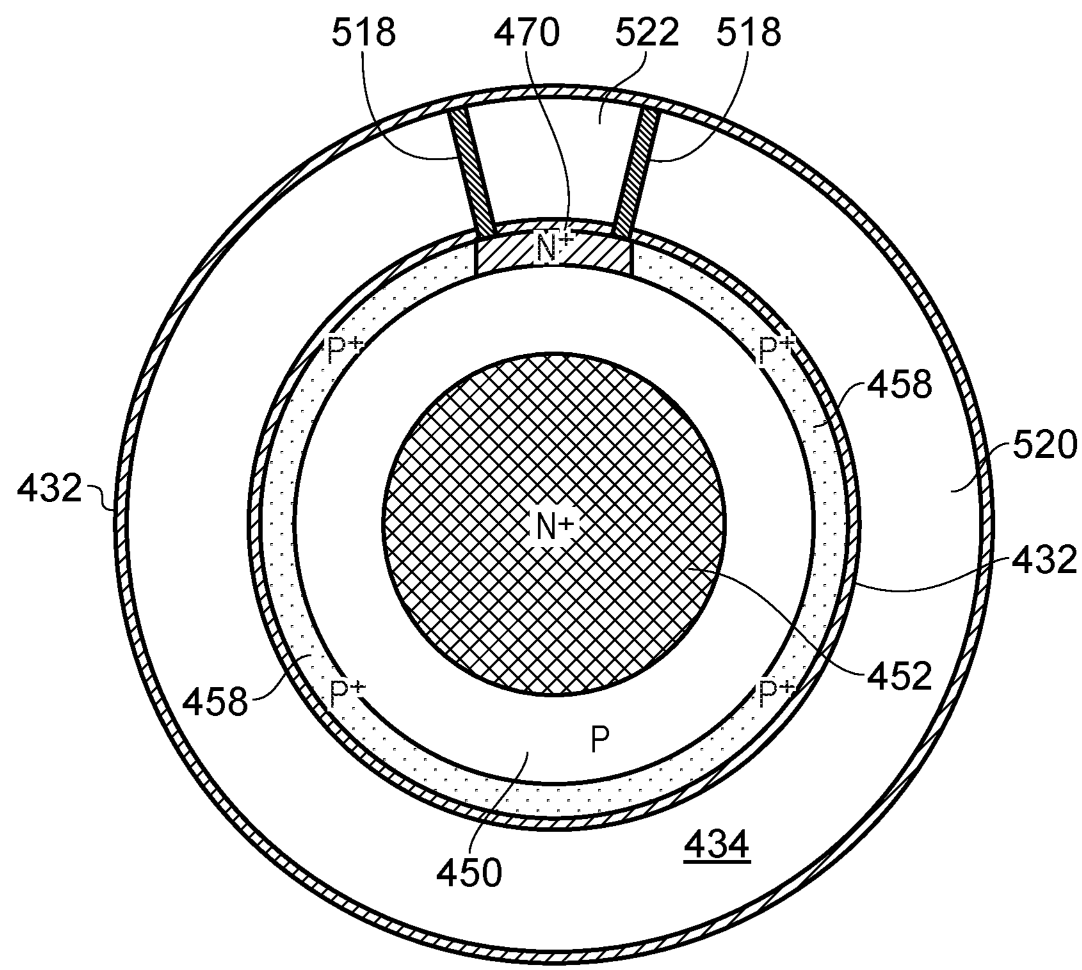
FIG. 8 is a plan view of an embodiment of this disclosure having an integrated drive FET.

However the structure shown in FIG. 6 can also have an integrated vertically formed drive FET formed therein so that an IGBT equivalent device can be formed, but with higher gain in the bipolar transistor section. This can be achieved by modifying part of the device to include a drive FET as shown in FIG. 8.

Figure 9:
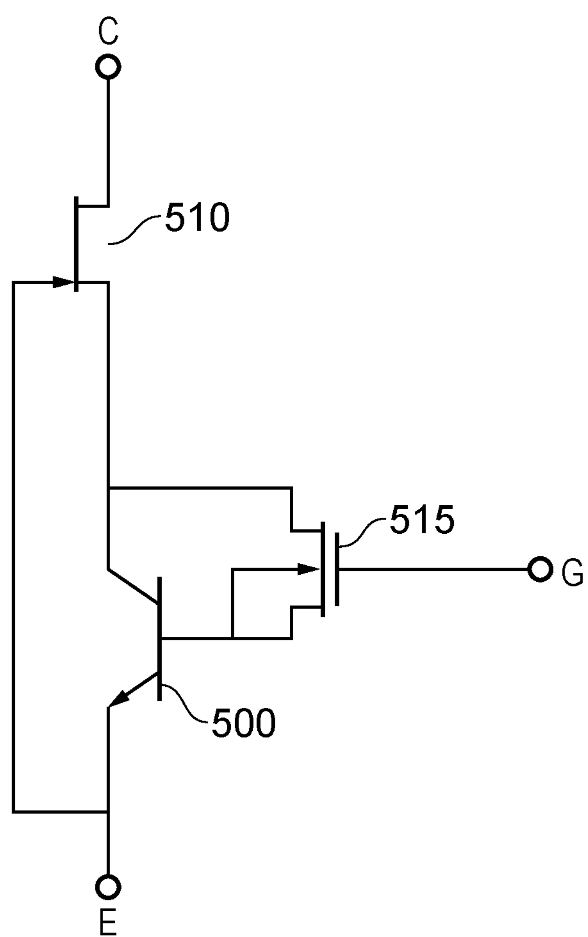
FIG. 9 is an equivalent circuit for the device shown in FIG. 6.

The drive FET can be formed by replacing the P+ region 458 in some parts of the device with an N+ material abutting or adjacent the wall of one or more trenches, and hence can be done at the same time as forming the emitter so this may not incur any additional processing steps. In the device shown in FIG. 8, the N+ region 470 forms the source of the drive FET. The source of the drive FET, designated 515 in FIG. 9, is connected to the base of the bipolar transistor in the equivalent circuit shown in FIG. 9, and hence no measures may be taken to isolate the region 470 from the base 450/458.

Returning to FIGS. 7 and 8, the N type region 420 (shown in FIG. 7) of the bipolar transistor also forms the drain of the drive FET 515 in these devices. In use, the drive FET opens a path for current to flow from the collector region 420 through a channel of the drive FET to region 470, where the current then flows to region 458 and hence to the base of the NPN transistor. Regions 458 and 470 may be connected to each other by way of a metal layer.

In this device structure as shown in FIG. 6 the regions 422 are arranged, in use, to fully pinch off the channel 424 when the voltage exceeds a pinch-off voltage of around 30 Volts (but the pinch off voltage could be more or could be less in other implementations) and the bipolar transistor is non-conducting. As a result the voltage across the NPN transistor 500 formed by regions 420, 450 and 452 is limited to 30 Volts or so irrespective of the potential difference across the entire device which may be over 1000 Volts.

The device can look to the user like an IGBT having a collector C and emitter E and a gate G.

To make the series FET 510 more robust, it can be advantageous to provide the series FET as a junction FET. This can avoid the formation of a gate insulating layer, as found in a metal oxide semiconductor field effect transistor (MOSFET), which might be damaged at high voltages. As a result the trench 432 of FIG. 6 is open at its bottom (orientated as shown in the Figure) such that the conductor 434 bounded by the insulating walls of the trench contacts with the P+ regions 422. The conductor 434 may be provided as a metal, or it may be more P+ doped silicon, such as polysilicon.

Returning to FIG. 9, it can be seen that the gate of the series FET 510 can contact with the emitter of the bipolar transistor 500. Therefore, with reference to FIG. 8, a metal contact can be made with the conducting material 434 and connected to the emitter contact. Under such circumstances, the trenched region may be sub-divided into two regions 520 and 522 by additional walls 518 as also shown in FIG. 8. The additional walls 518 can be insulating walls formed of any suitable dielectric material. The region 520 forms a via to reach the P+ regions 422 of the series JFET. The region 522 adjacent the N+ doping 470 acts as the gate for the control FET 515. The region 522 is bounded below the illustrated surface of the device by the insulating material of the trench such that the gate of the control/drive FET is formed in an insulating well and should not be exposed to the high voltages seen by the series FET. This can provide good insulation between the drive voltages supplied to the gate of the drive FET and the voltages switched by the transistor. However, the MOSFET style of the drive FET could be replaced by a junction FET in certain implementations.

The formation of the relatively smaller drive FET, with its smaller gate in the insulating well means that the parasitic gate capacitance associated with the drive FET 515 should be much smaller than that of a conventional IGBT. As a result transient current flows, i.e. inrush currents, at switching can be much reduced and it can be easier and less power consuming to drive the device between conducting and non-conducting states. The drive FET can be smaller because the bipolar gain can be much greater than in a conventional IGBT.

Figure 10A:
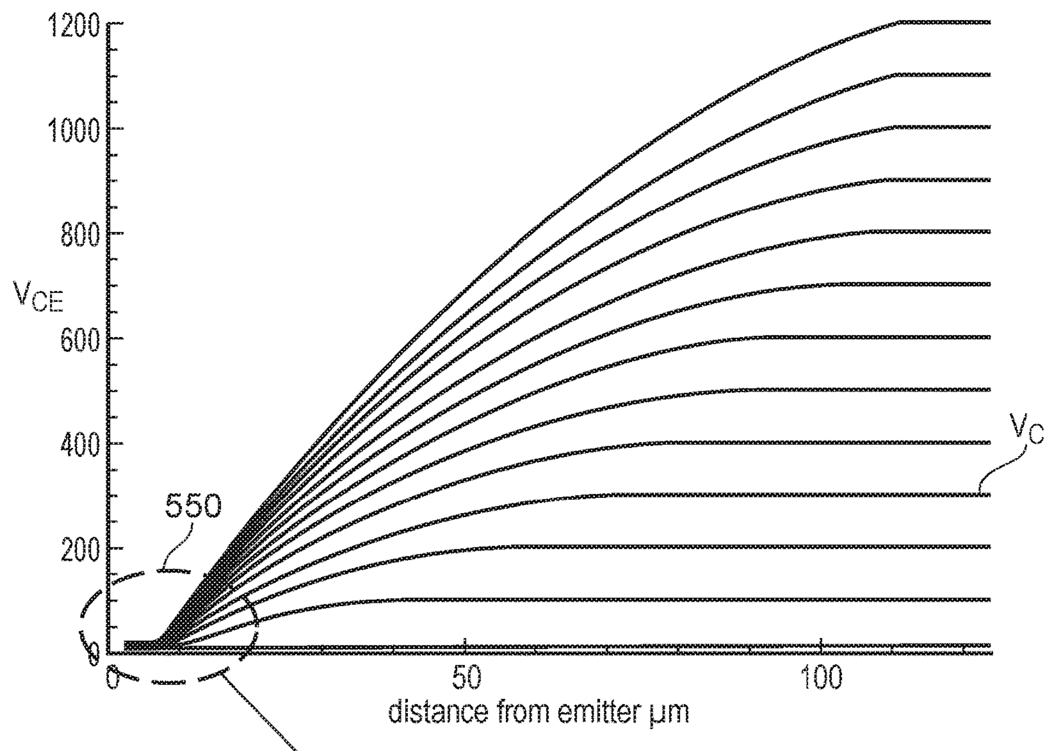
FIGS. 10A and 10B are plots of the potential within the device as a function of the distance from the top of the device of FIG. 9 for various collector voltages.
Figure 10B:
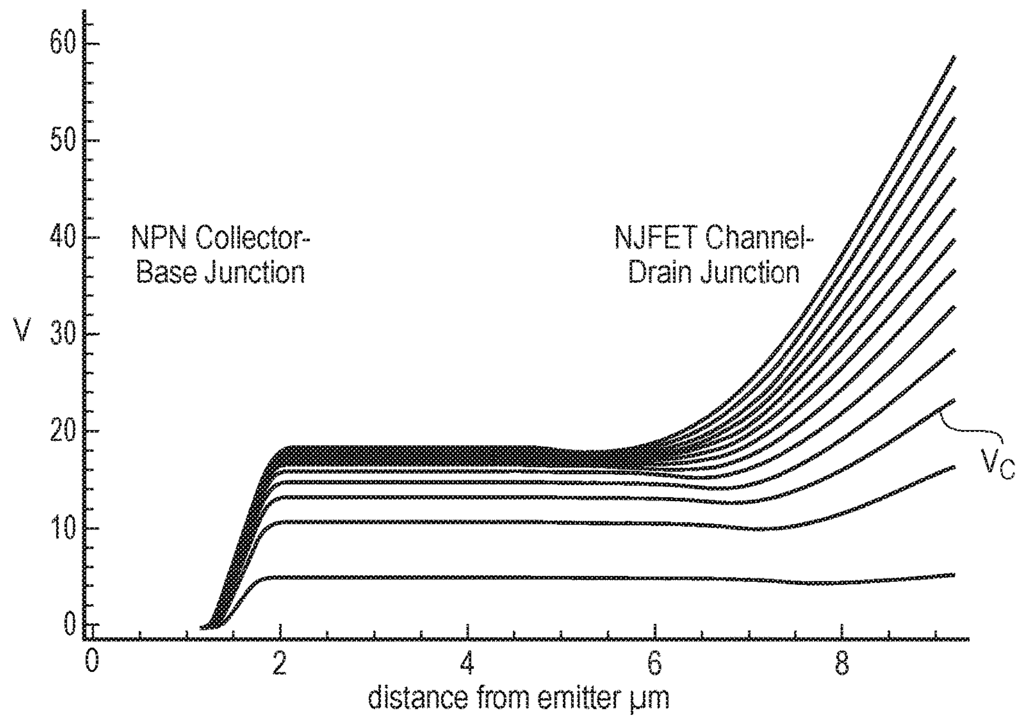

FIGS. 10A and 10B show a plot of potential within the device in accordance with FIGS. 7 to 9 as a function of distance for the device in an off state for various collector voltages Vc. FIG. 10A shows that the voltage decreases as we approach the emitter of the device, with a region 550 where the voltage between the collector and the emitter Vce of the bipolar transistor drops more quickly. The region 550 is shown in greater detail in FIG. 10B and shows that, in certain embodiments, at distances of between about 6 μm from the emitter (the center of the P+ regions 422) and the edge of the base of the bipolar transistor at about 2 μm from the emitter, the voltage is limited to the pinch-off voltage of the series FET 510. Thus the NPN bipolar transistor should not be exposed to dangerous voltages.

Returning to FIG. 6, it had been indicated that the region 412 is relatively highly doped. However the type of doping had not been specified. It can be seen that a N type doping such that region 412 is N+ makes a natural device structure as this then forms an N type extension to the FET. The N+ doping may be in the region of $10^{19}$ or more impurities per $cm^3$.

Figure 11:
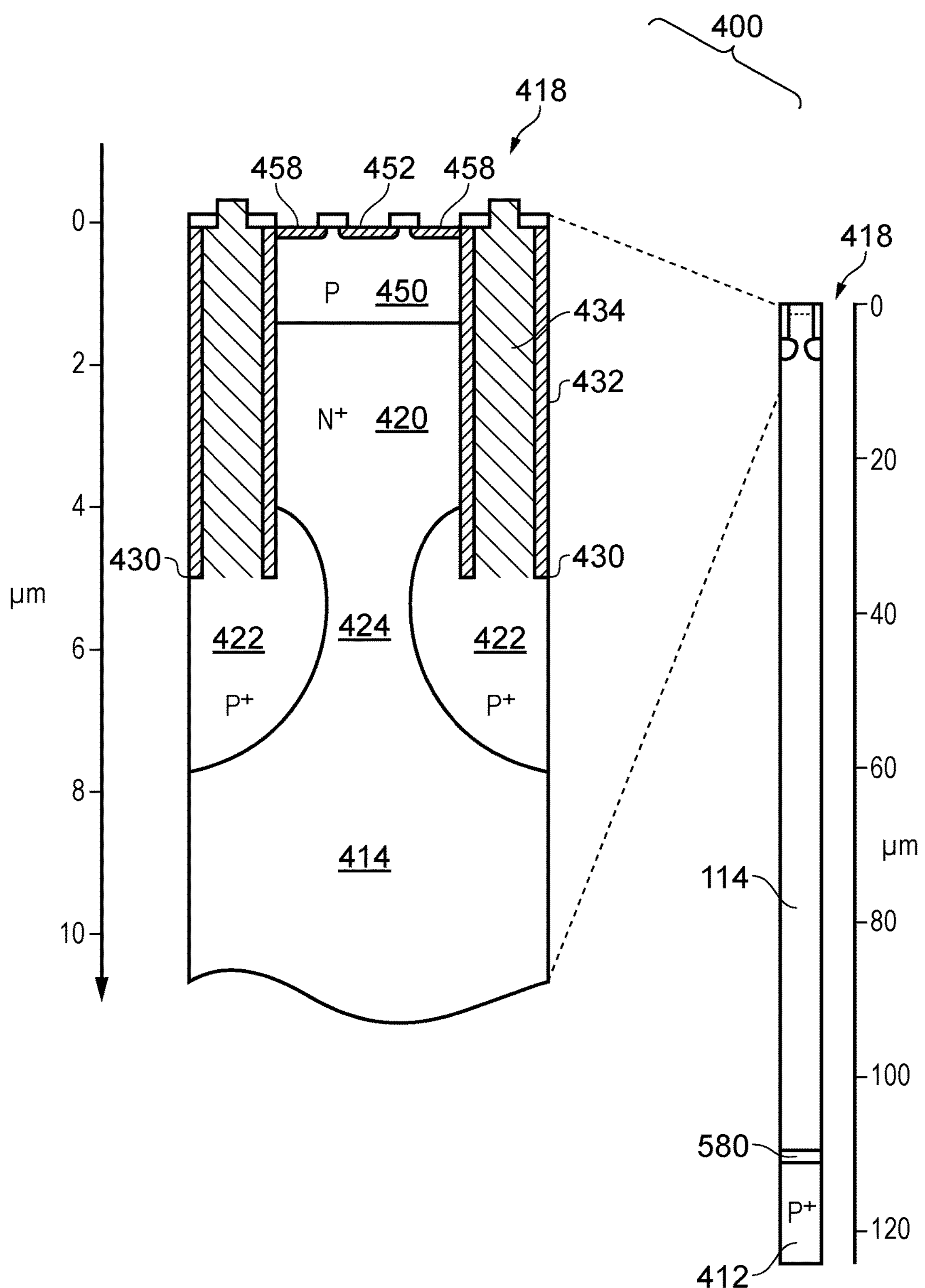
FIG. 11 shows a variation of the arrangement shown in FIG. 6.

However, and less intuitively, the region 412 may alternatively be doped to be P+ thereby effectively forming a series connected PNP transistor with the FET, where the regions 422 forms the collector, region 414 forms the base and region 412 forms the emitter of the series PNP transistor. The base of the PNP transistor is electrically connected to the drain of the series FET. Such a device is shown in FIG. 11. A further region 580 may be provided intermediate the P type region 412 and the N type epitaxial layer 414. The further region 580 may be quite thin relatively to the regions 412 and 414. The further region 580 can be relatively highly N type doped to form an anti-punch through layer.

Figure 12:
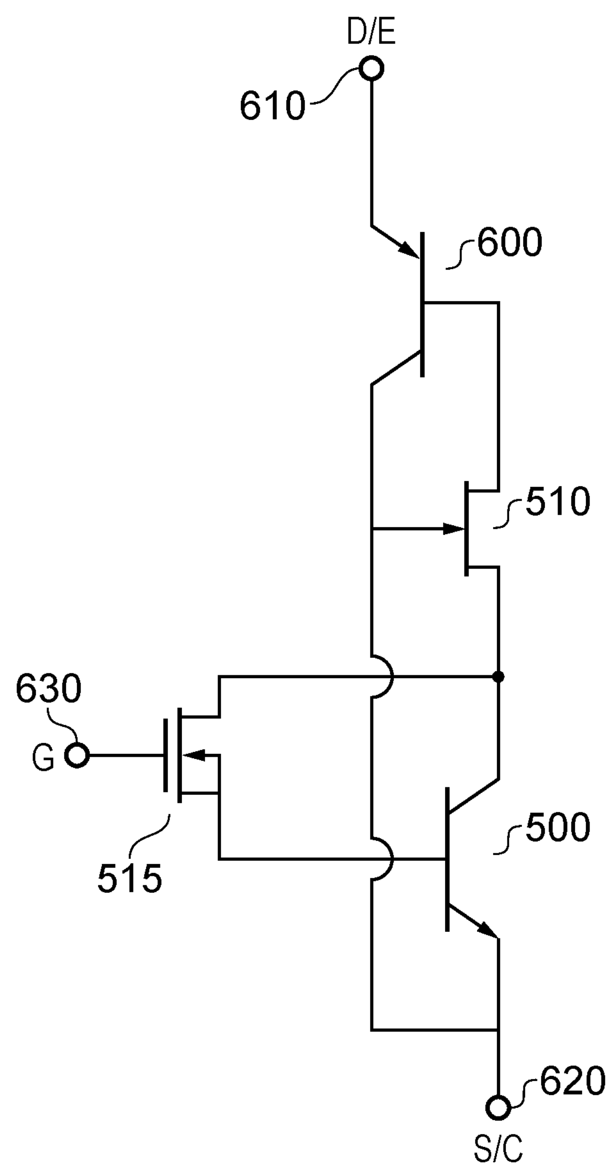
FIG. 12 is an equivalent circuit for the device shown in FIG. 11.

An equivalent circuit for the structure shown in FIG. 11 is shown in FIG. 12. Comparing FIG. 12 with FIG. 9, both Figures show an NPN transistor 500 receiving its base current by way of the input insulated gate drive FET 515. Furthermore both show that a JFET 510 is in series with the collector of the NPN transistor 500. However by including the additional P type doping a further PNP transistor 600 is formed with its emitter connected to one terminal 610 and its collector connected to terminal 360. In this device the terminal 610 can be considered as a drain or emitter, the terminal 620 is the source or collector, and terminal 630 is a gate as there is nominally no DC current at it.

This device can exhibit a higher gain as a result of two bipolar transistors acting in unison such that the current through the device Idev is given by $$Idev=((\beta pnp+1)*((\beta npn+1)*Imos \qquad \text{Eqn. 2}$$

where

βpnp is the gain of the PNP transistor (which can be quite low)

βnpn is the gain of the NPN transistor, and

Imos is the current flowing through the input MOSFET.

The arrangement shown in FIG. 11 has a lower on resistance than the device shown in FIG. 6 or 8 due to the carriers across the N type epitaxial layer 414 being holes, but as these are minority carriers they are slower than majority carriers and hence the device should have a slower response time that the device shown in FIG. 6 where the carriers that cross the epitaxial layer 414 are electrons and being majority carriers move more quickly through the layer 414.

Figure 13:
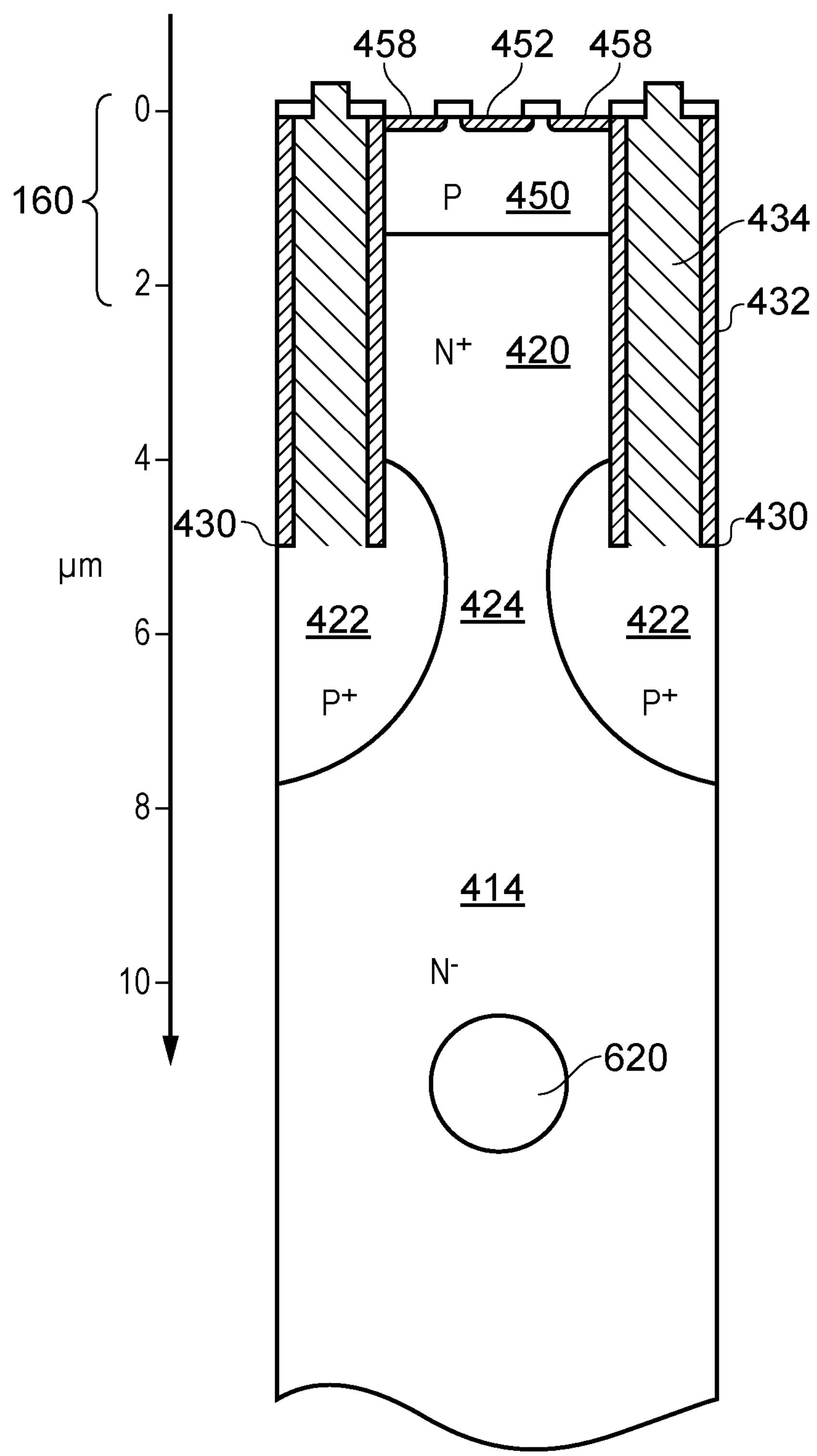
FIG. 13 is a cross section showing a further variation that can be applied to all of the embodiments.

In simulation a fairly large bipolar transistor current flows in the vertical direction midway between the trenches, and follows a similar path after the end of the trench. This has not been found to be a problem, but it may be beneficial to spread the current flow more evenly through the bulk of the transistor. This can be advanced by forming a discontinuity in the series FET a little way below the pinched off region. This can be achieved by placing a region of different doping density within the extended channel portion of the FET. Taking the arrangement of FIG. 6 as an example a small region of lower doping, designated 620 in FIG. 13, is provided to spread the current flow. A relatively small region of opposite doping can alternatively or additionally act to spread the current flow.

Figure 14:
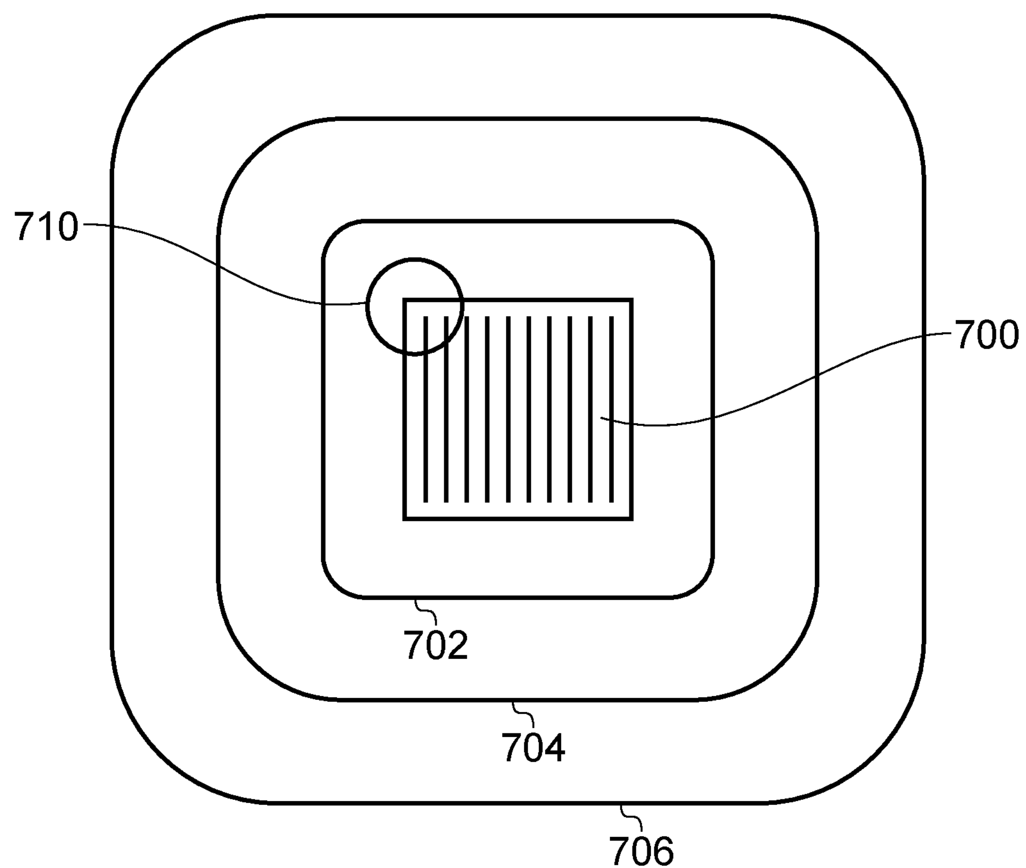
FIG. 14 is a plan view of a further device in accordance with the teachings of this disclosure.

FIG. 14 is a plan view of the upper surface of an implementation of a transistor is accordance with this disclosure. The trench region containing a plurality of linearly formed emitters and gates is generally designated 700. Floating doped trenches 702, 704 and 706 encircle the device to diminish the intensity of E fields around the device. Part 710 of the trench region 700 is shown in greater detail in FIGS. 15A and 15B. The floating doped trenches 702, 704, and 706 can surround the trench region 700 in any suitable shape.

Figure 15A:
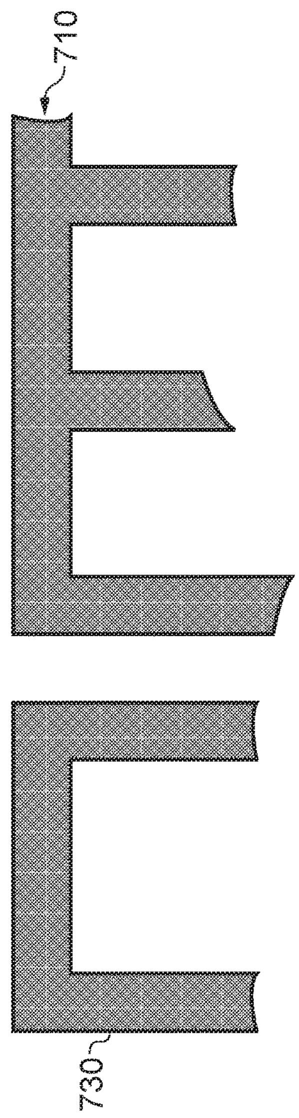
FIG. 15A shows part of the device of FIG. 14 in plan view in greater detail and FIG. 15B shows a cross section though the device.
Figure 15B:
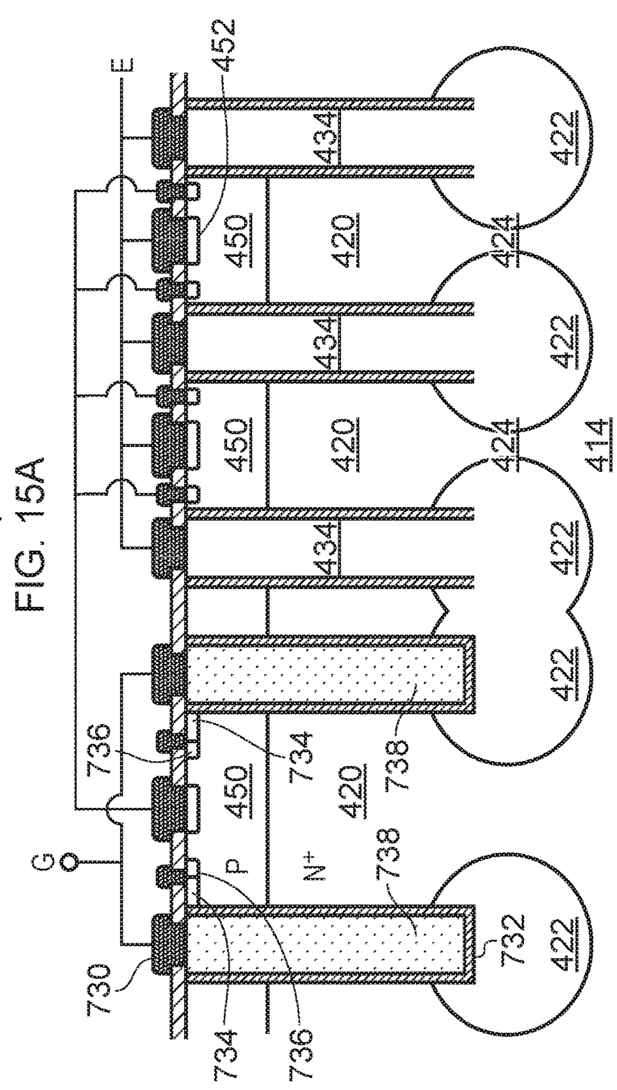

In FIGS. 15A and 15B, the expanded area 710 serves to illustrate that the drive transistor structure having trenches closed at their feet can be formed adjacent the connections to the series FET. A metal track 730 forms the connection to the control gate, being the gate of the drive transistor 515 which can have a structure similar to that described with respect to FIG. 3, except that the drive transistor can occupy a relatively small area (e.g., about 1% of so) the device. As illustrated in FIG. 15B, the control gate 730 is connected to a trench that is closed at its foot by dielectric material 732. An N+ implant 734 is formed adjacent the insulating wall of the trench and is electrically connected to a P+ implant 736 in the device of FIG. 15B. Applying a positive voltage to the control electrode 730 can cause the insulated gate material 738 in the closed trenches to deplete the P type material adjacent the trench and thereby to conduct current from the collector material 720 via a depleted channel to the N+ implant 734. From here the current may be picked off and supplied to the base regions of the IGBT, generally designated 750, or the current may be transferred to region 736 and injected into the base layer 450 of the transistor formed adjacent the drive FET and bounded by the gate 730, and this additional current which has been gained up by the bipolar transistor associated with the drive FET can be supplied to the base regions of the IGBT device. This can give a drive FET and Darlington transistor configuration, which has been illustrated in FIG. 15*b*. In the region 750, where a gate of the FET is connected to the same potential as the IGBT emitter, the trenches are open at their bottom so that the implant 422 can be held at the emitter voltage as discussed with respect to FIG. 6. This configuration covers the majority, for example, about 99%, of the trenched emitter/base region of the transistor.

As noted before, the series connected FET can be arranged to be "pinched off" in order to protect the bipolar transistor. The ability to pinch off the device off can depend on the depletion regions extending from each gate implant 422 being able to extend by more than about half the width of the associated channel of the device.

Figure 16:
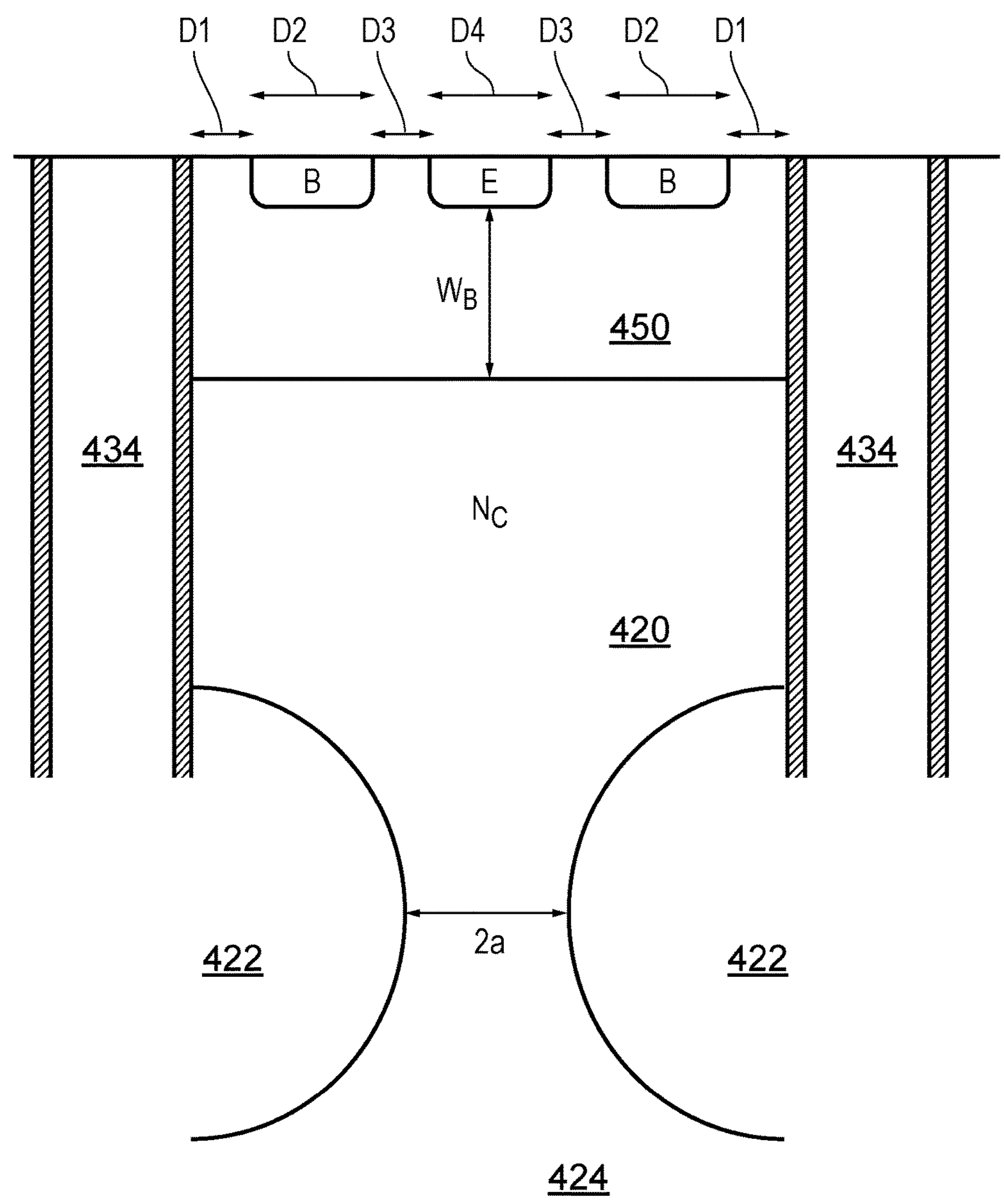
FIG. 16 shows a cross section for the purpose of discussing the device physics of an embodiment of this disclosure.

FIG. 16 shows the device structure with the base depth is designated Wb and the distance between the implanted regions 422 which defines a channel width is designated 2*a*. The collector doping concentration is Nc in FIG. 16. In general, for good current handling a relatively highly doped collector is desired as $$J_{max}=N_c e V_{sat} \qquad \text{Eqn. 3}$$

Where Jmax is the maximum current density, e is the charge on an electron and Vsat is the saturation voltage for the semiconductor material.

However Nc can also play a part in the pinch off voltage of the series connected FET and also in the breakdown voltage of the bipolar transistor. The pinch off voltage Vp is given by $$V_P = \frac{eN_c(a^2)}{2\varepsilon_{si}} \qquad \text{Eqn. 4}$$

Where a is half the width of the transistor (half the distance between the implanted regions 422 because each region can grow with applied channel to gate voltage we can only consider the desire for each one of the depletion regions to grow by half the channel width) and $\varepsilon_{si}$ is the permittivity of the semiconductor, generally silicon. The relative permittivity for silicon is around 11.68. Nc is an SI unit in equation 4 and hence is expressed in impurities per meter cubed. Consequently, for example, a donor concentration of and hence $10^{17}$ $cm^{-3}$ would become $10^{23}$ $m^{-3}$.

Thus increasing Nc increases the pinch off voltage, as does making the device wider.

Turning to the bipolar transistor breakdown voltage, BVceo can be expressed as $$BVceo = \frac{\varepsilon_{si}E_{max}}{2eN_C} \qquad \text{Eqn. 5}$$

Where Emax is a constant and represents the maximum E field that the material of the device can stand before breaking down and which can be related to a maximum device voltage Vmax by $$E\text{max}=V\text{max}/Wb \qquad \text{Eqn. 6}$$

As we want pinch off to occur before the bipolar transistor breaks down, we can write $$\frac{eN_c(a^2)}{2\varepsilon_{si}} \leq \frac{\varepsilon_{si}E_{max}}{2eN_c} \qquad \text{Eqn. 7}$$

This gives a relationship between the channel width as defined by the gap left between the regions 122, pinch off voltage, breakdown voltage and maximum current density.

To give an indication of functional device sizes, for the device shown in FIG. 16:

2*a*=1 μm (but may typically range between 0.5 μm and 3 μm);

D1=around 0.5 μm to 0.6 μm;

D2 is about 0.7 μm;

D3 is approximately 0.3 μm; and

D4 is approximately 0.7 μm.

These sizes are only given by way of example and are not limiting as other device sizes can be implemented in accordance with the principles and advantages discussed herein. The doping concentration in the channel region can be varied considerably, giving the designer considerable control of the FET pinch off voltage.

Figure 17:
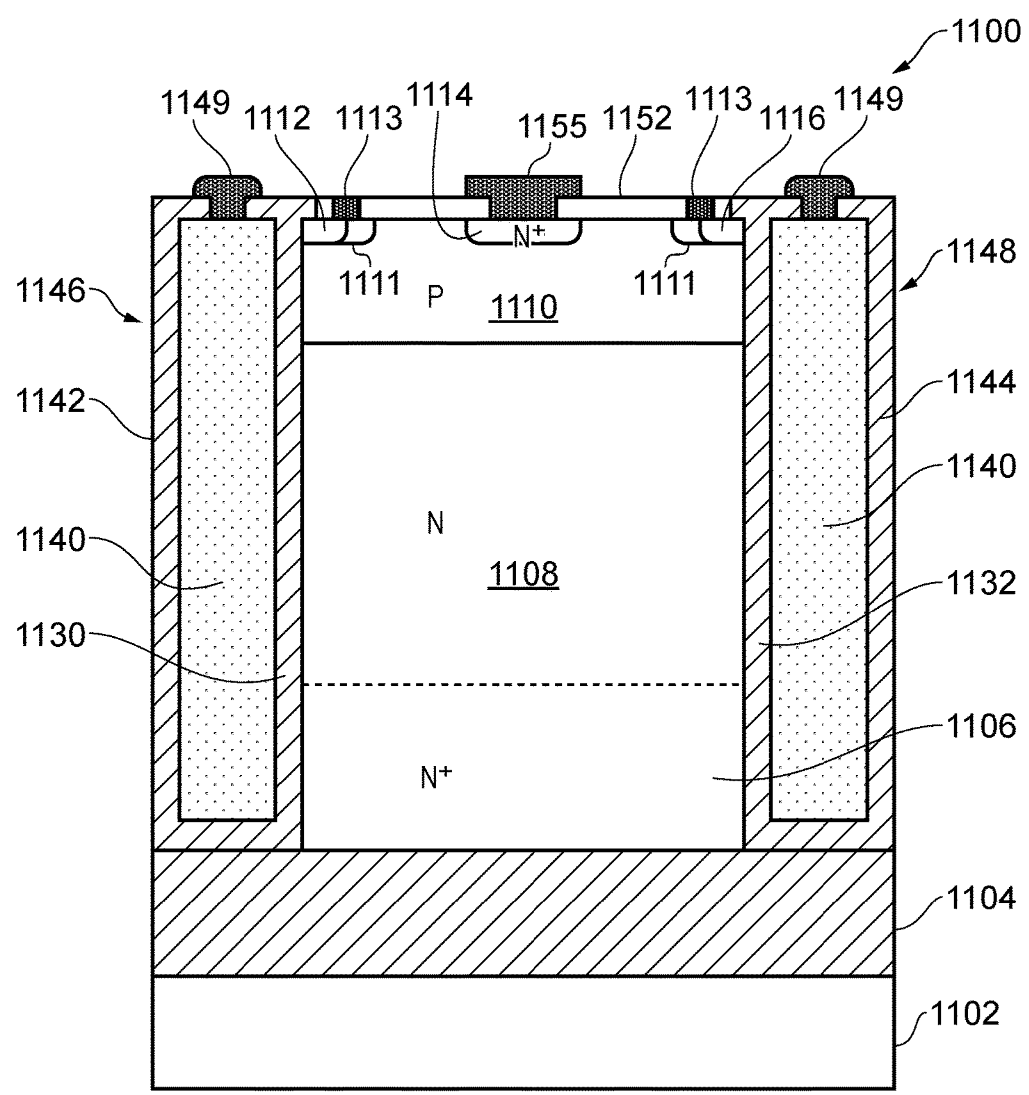
FIG. 17 is a cross section through a further embodiment of a power switch.

FIG. 17 is a cross section through another switch device fabricated in accordance with this disclosure. The device, generally designated 1100, forms a semiconductor switch and to a user behaves as if it were an IGBT.

The device shown in FIG. 17 utilizes silicon-on-insulator, SOI, fabrication techniques to form an isolated well. The principles and advantages discussed herein can be applied to any other suitable semiconductor on insulator technologies. The device shown in FIG. 17 may be part of a larger wafer or die, but for diagrammatic simplicity portions of the wafer beyond the edge of the device have not been illustrated. The wafer comprises a handle wafer 1102 over which a dielectric layer 1104, for example silicon oxide, is formed. A further layer of silicon is 1106 is provided over the oxide layer 1104. The layers 1102, 1104 and 1106 generally represent the form in which an SOI wafer is provided by its manufacturer.

The layer 1106 is subjected to a doping implantation of donor atoms so as to make the layer 1106 into an N type semiconductor. The layer 1106 is generally relatively heavily doped, and this heavy doping is designated N+ as known to the person skilled in the art. This makes it relatively highly conducting. An N type epitaxial layer 1108 is grown over the layer 1106. Layer 1108 is less heavily doped than the layer 1106. The epitaxial layer can be grown to the upper surface of the device, and the doping changed to an acceptor impurity in order to form a relatively thin P type region 1110 above the N type layer 1108.

Alternatively the upper portion of the epitaxial layer could be subjected to a further doping step and thermal cycle to form the relatively thin P type region 1110. This can give a graded diffusion where the P type doping concentration in the region 1110 is greatest at its surface and diminishes with increasing distance from the upper surface of the device. Thus the top surface of the region 1110 could be designated P+. Alternatively relatively highly P+ doped regions 1111 can be formed in the surface of the P type region 1110. Their purpose will be discussed later.

An advantage of stopping the epitaxial grown at the top of the N type layer 1108 is that it allows the bulk of the device to be irradiated (if so desired). Irradiation can be used to create defects in the lattice that act as lifetime killers to reduce the minority carrier lifetime, but without damaging the silicon 1110 that is used to form the base of the bipolar transistor or the emitter region 1114 by virtue of the fact that these regions are not formed until after the optional irradiation step has been performed.

Regions 1112, 1114 and 1116 having a relatively high N type doping concentration are provided at the surface of the device. Such regions can be formed by deposition of a mask, patterning of the mask and selective etching thereof to reveal the regions 1112, 1114 and 1116 for dopant implantation, to create N+ regions.

It can be seen that the vertical structure formed by regions 1106, 1108, 1110, 1112, 1114 and 1116 is bounded by vertically extending insulating walls 1130 and 1132 which extend from the surface of the device to the dielectric layer 1104. The insulating walls 1130 and 1132 can comprise any suitable dielectric material. These walls serve to delimit the spatial extent of those regions 1106, 1108, 1110, 1112, 1114 and isolate them from other parts of the wafer, but the walls 1130 and 1132 also isolate a gate electrode 1140 from the regions 1106, 1108, 1110, 1112, 1114. The gate electrode is bounded by further walls 1142 and 1144 such that the gate electrode is defined by a conductor, such as metal or doped silicon or doped polysilicon, within trenches 1146 and 1148. A gate contact 1149 is made to the gate 1140.

Figure 18:
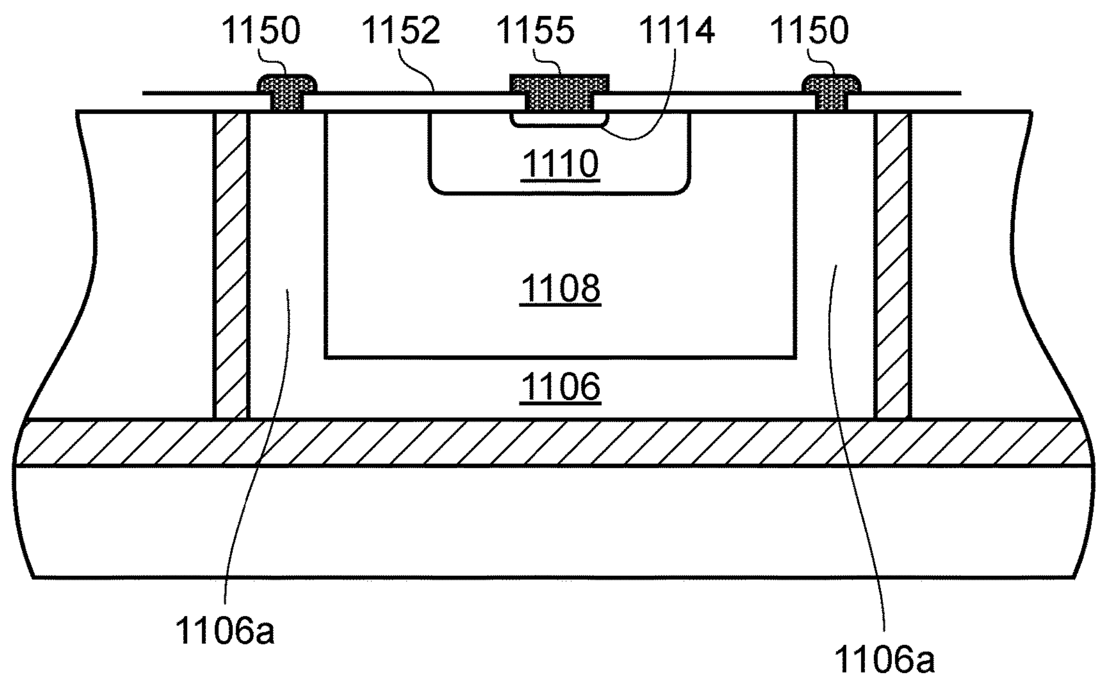
FIG. 18 is a cross section through a plane orthogonal to that of FIG. 17.

The device shown in FIG. 17 also extends above and below the plane of FIG. 17 and the buried relatively highly doped layer 1106 is brought up to surface contacts at either end of the isolated tub of semiconductor by way of relatively highly doped regions 1106*a*, as shown in FIG. 18. The relatively highly doped regions 1106*a* make contact with a conductor 1150 which forms a collector/drain of the device. Similarly a metallic contact 1155 is formed over the region 1114 which functions as an emitter/source of the device. The device is covered with passivation material as layer 1152.

Figure 19:
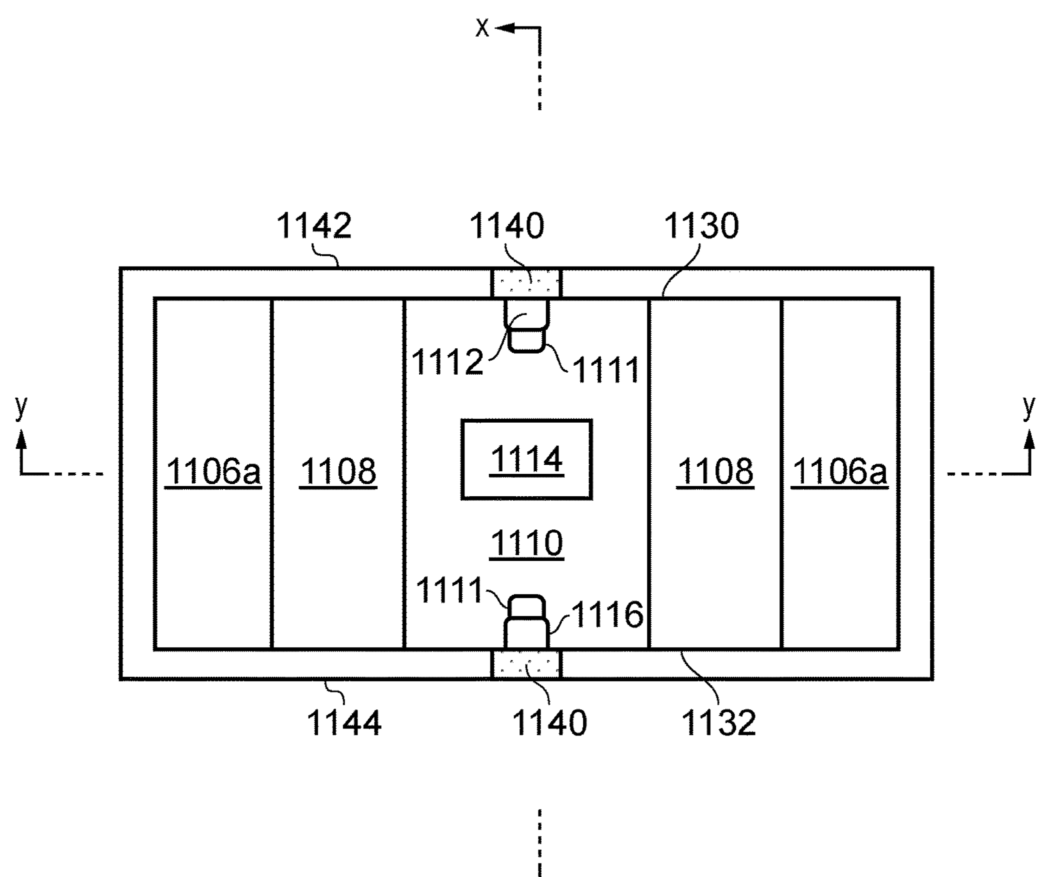
FIG. 19 is a plan view of the transistor shown in FIGS. 17 and 18.

FIG. 19 is a plan view of the device shown in FIGS. 17 and 18 without the passivation or metal layers being shown. In other variations multiple drive FET implants may be formed.

As shown in FIG. 19, it can be seen that the drive FET regions 1112, 1116 only take up a relatively small area of the completed device. As such, the area of the gate 1140 can become much smaller, in fact β times smaller where β is the gain of the NPN transistor compared to the PNP of the prior art at IGBT device. Since β is often greater than 50 and can be in the range of 100 or more, the gate 1140 can be implemented in relatively small areas of the trench that defines the isolating tub for the device. Thus much less area can be consumed by the drive FET compared to the active (current carrying) area of the device than is the case with prior art drive FET structures in prior art IGBTs. This can reduce the footprint on the device, although it will be appreciated that bringing the collector/drain layer 1106 back to the surface to make this device compatible with standard fabrication processes offered by semiconductor 'Fabs' uses additional wafer area. Nevertheless the approach used herein can still result in the formation of a high voltage transistor with much reduced drive current to cope with switching between states, and one which can be provided on an integrated circuit and connected to other components by way of contracts all on the same side of the wafer.

FIG. 19 also shows the lines of cross-section for FIGS. 17 and 8. FIG. 17 is a cross-section along line x-x and FIG. 18 is a cross section along line y-y.

Thus, we have a higher gain NPN transistor, which offers higher gain for similar dimensions compared to a PNP transistor, and where the NPN transistor is formed in an insulated well with a series FET that can limit the voltage across the NPN transistor when the NPN transistor is non-conducting. As illustrated, the NPN transistor comprises a collector region 1108, a base region 1110, and an emitter region 1114. As also illustrated, the series FET comprises a gate 1140, a drain 1106, and a source in region 1108.

The device of FIGS. 17 and 18 may be formed on a die with a drive transistor located elsewhere on the die so as to emulate IGBT functionality or it may be used as a relatively high gain relatively high voltage bipolar transistor. In which case the regions 1112 and 1116 may not be formed and connections can be made to the base region 1110, optionally by way of highly doped P type regions 1111, to provide a way of introducing a base current.

The structure shown in FIG. 17 has an integrated vertically formed drive FET formed therein so that an IGBT equivalent device is formed, but with higher gain in the bipolar transistor section. This, as discussed before, is achieved by the provision of the doped regions 1112 and 116 which replace the P+ region 1110 in some parts of the device with an N+ material, and hence can be done at the same time as forming the emitter 1114 so this does not incur any additional processing steps. The N+ regions 1112 and 1116 form the source of the drive FET. The source of the drive FET 1215 is connected to the base of the bipolar transistor by virtue of being fabricated within the base region 1110 and by being connected to P+ regions 1111, for example by a metal contact 1113 as shown in FIG. 17. An equivalent circuit is shown in FIG. 20.

Figure 20:
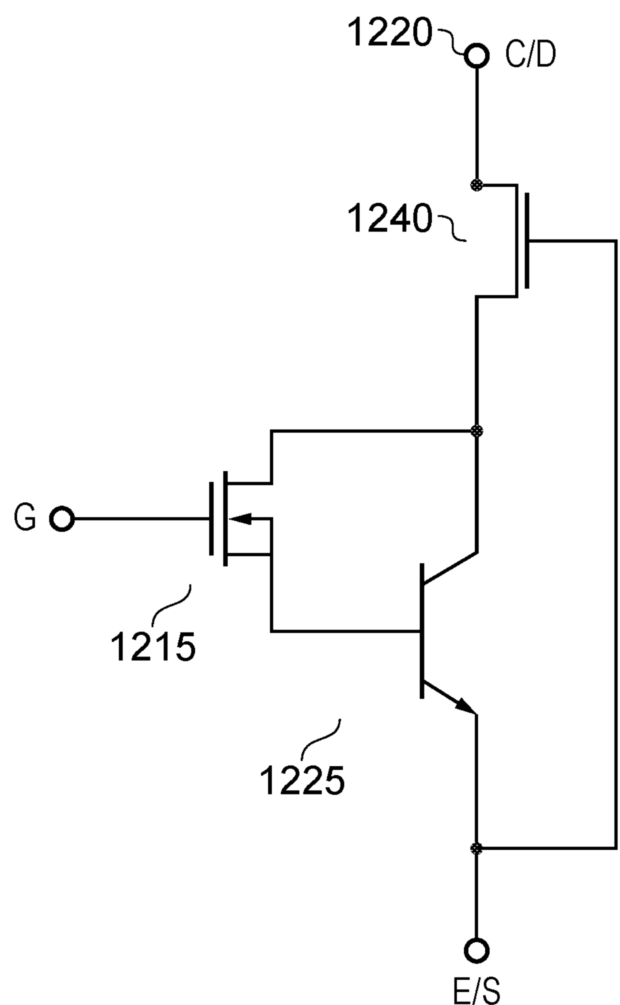
FIG. 20 is an equivalent circuit for the transistors shown in FIGS. 17 to 19.

Referring to FIGS. 17 and 20, the N type region 1108 of the bipolar transistor also forms the drain of the drive FET 1215. In use, the drive FET 1215 opens a path for current to flow from the collector region of the bipolar transistor 1225, the collector being formed in part by region 108 shown in FIG. 17 through a channel of the drive FET 1215 to region 1112 and 1116, where the current then flows to region 1110 and hence to the base 1110 of the NPN transistor.

The device looks to the user like an IGBT having a collector C and emitter E and a gate G.

The series FET 1240, is a MOSFET like structure, and strictly is a poly-oxide-silicon field effect transistor, POS-FET, in a preferred embodiment.

The drive FET 1215 has its gate formed by the conducting material 1140 which is insulated from the regions 1106, 1108 and 1110 of the device by the insulating walls 1130 and 1132. The gate 1140 can be formed in a trench bounded by insulation to isolate the gate, and hence the drive circuits connected to the gate can be protected from the higher voltages that may occur in the transistor device shown in FIG. 17. The voltage of the gate 1140 may be raised with respect to the emitter voltage. The forward biased PN junction between the base region 1110 and the emitter region 1114 stops the base region 1110 from becoming more positive than about 0.7 Volts above the emitter voltage in certain embodiments. Taking the gate voltage more positive than that can start to deplete the P type material of the base adjacent the insulating walls 1130 and 1132, thereby effectively turning that region into an N type region of semiconductor, which can cause a current to flow between the N type region 1108 and the N type regions 1112/1116 by way of the depleted regions. Current arriving at the effective source regions 1112 and 1116 can then flow into the base region 1110 via P+ regions 1111 and switch the NPN transistor on.

Figure 21A:
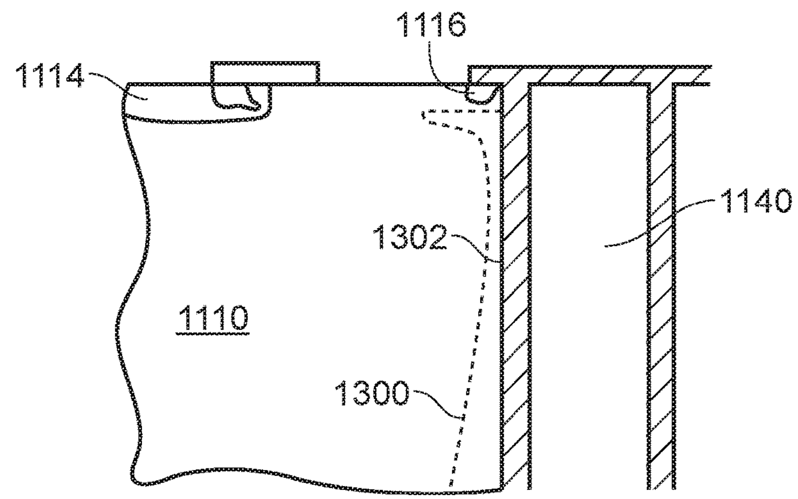
FIG. 21A shows depletion region boundaries.
Figure 21B:
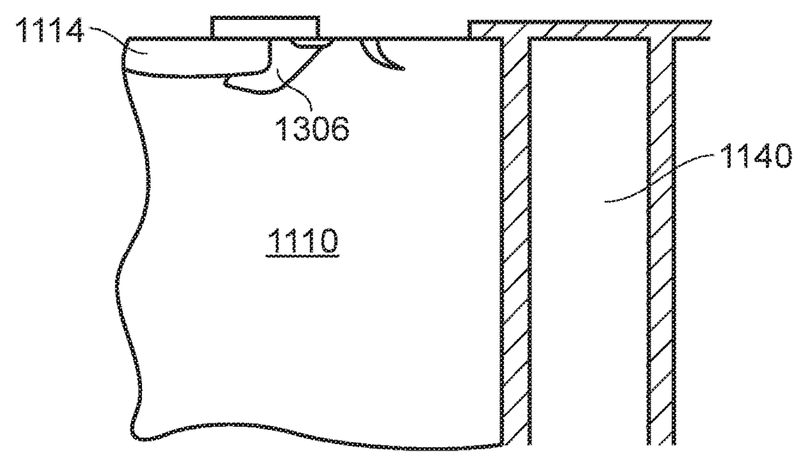
FIG. 21B shows distribution of base current and FIG. 21C shows distribution emitter current.
Figure 21C:
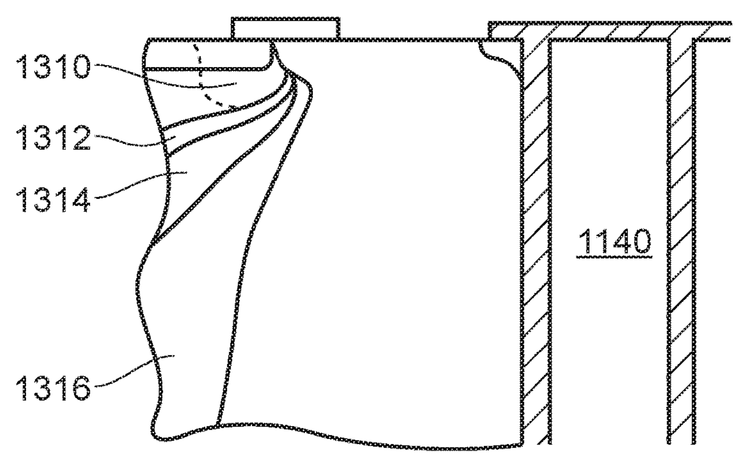

FIG. 21A shows part of the device in greater detail and in particular shows the depletion region boundary 1300 near the insulating wall and the MOSFET channel current 1302 adjacent the wall when the drive FET 1215 is conducting. FIG. 21B shows the distribution of the base current, with the greatest current density occurring in region 1306 at the corner of the emitter region 1114. FIG. 21C shows the emitter current path with region 1310 having the highest current density, region 1312 having reduced current density but more than region 1314, and region 1316 having less current density than region 1314.

Figure 22:
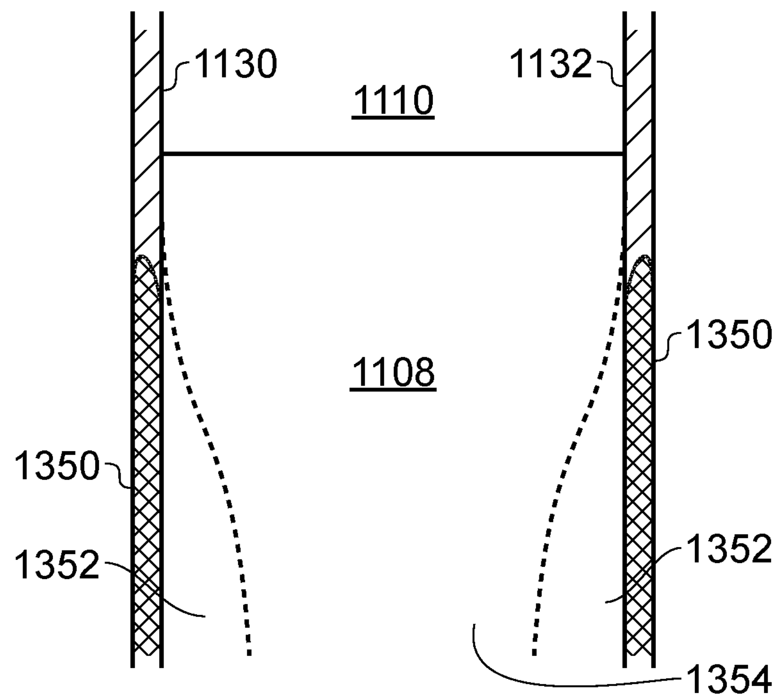
FIG. 22 schematically illustrates E-field strength.

FIG. 22 schematically illustrates E-field strength within the FET portion of the device. As illustrated, the greatest E-field strength occurs at regions 1350 within the dielectric material 1130 and 1132 of the trench. Much reduced E-field strength occurs in regions 1352 and the weakest E-field shown is found in region 1354.

Figure 23:
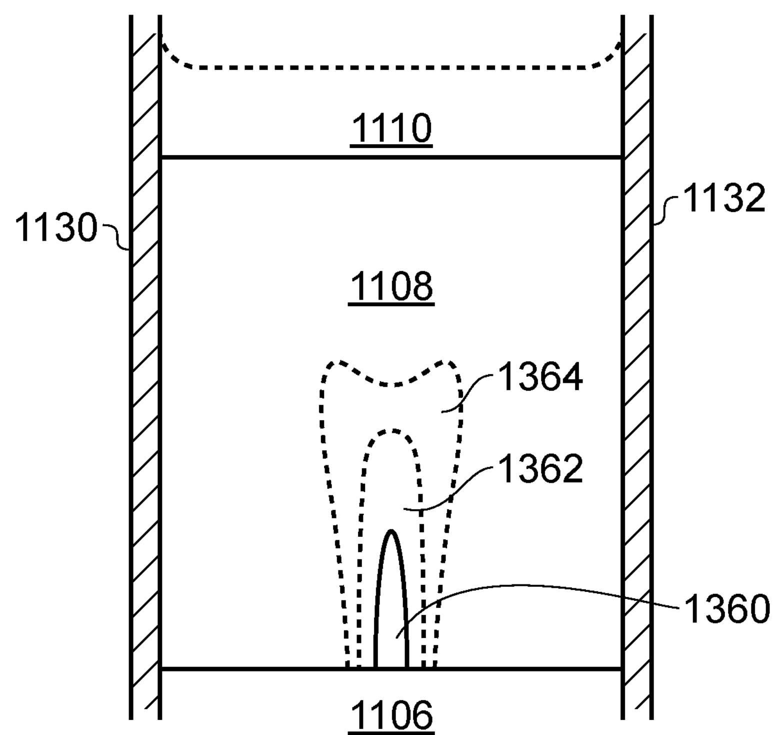
FIG. 23 schematically illustrates FET current density.

FIG. 23 shows FET current density as a function of position when the device is conducting. As illustrated, the current is largely confined to the center of the device with the greatest current density being in region 1360, with progressively reduced current density in regions 1362 and 1364.

FIGS. 22 and 23 do, however, show that the regions of greatest current flow are separated from the regions of highest E-field, which is good as it makes the device robust against avalanche breakdown mechanisms.

The embodiment described here was for a linear device configuration but other shapes are possible, and devices exhibiting circular or elliptical structures can be formed, as can horizontal devices. Any of the principles and advantages discussed herein can be applied to any suitably shaped device configuration.

As noted before, the series connected FET (1240 FIG. 20) should be "pinched off" in order to protect the bipolar transistor (1225 FIG. 20). The ability to pinch off the device off depends on the depletion regions extending from each gate electrode being able to extend by more than half the width of the device.

Figure 24:
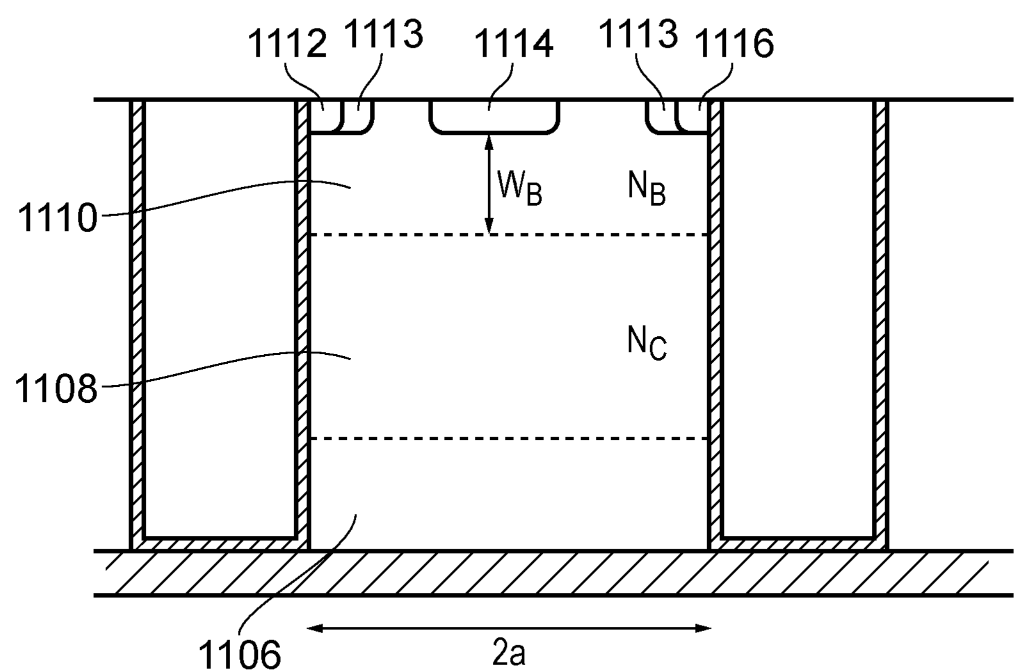
FIG. 24 shows device structure for the purposes of defining spatial variables therein.

FIG. 24 shows the device structure with the base depth designated Wb and the distance between the gates designated 1002*a*. The collector doping concentration (in collector region 1108) is Nc. It can be seen that the dimensions are similar to those discussed with respect to FIG. 14, and equations 3 to 7 apply to this device too.

Figure 25B:
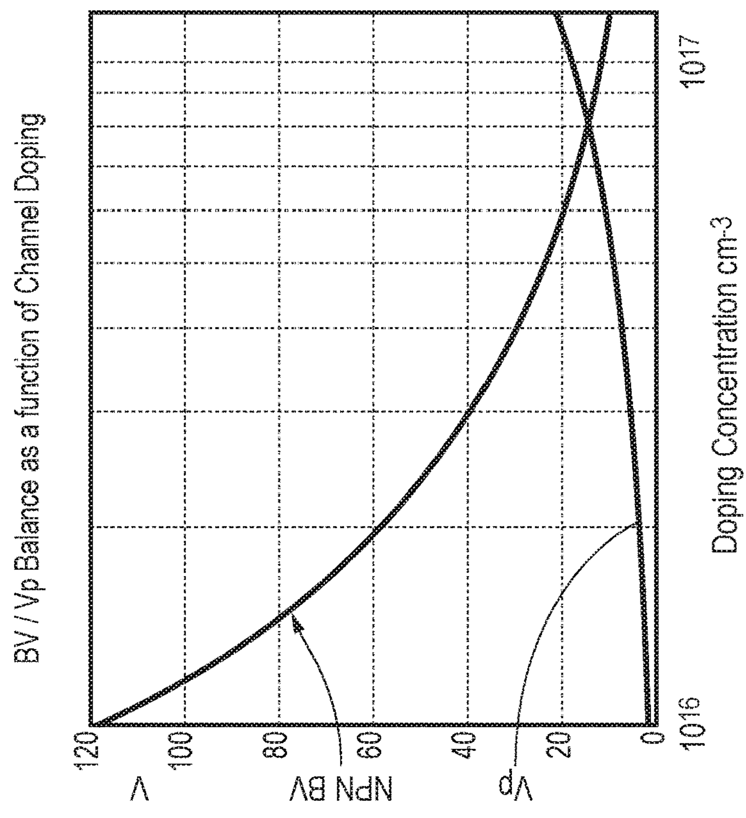
FIG. 25B shows pinch-off voltage and break-down voltage versus current density.
Figure 25A:
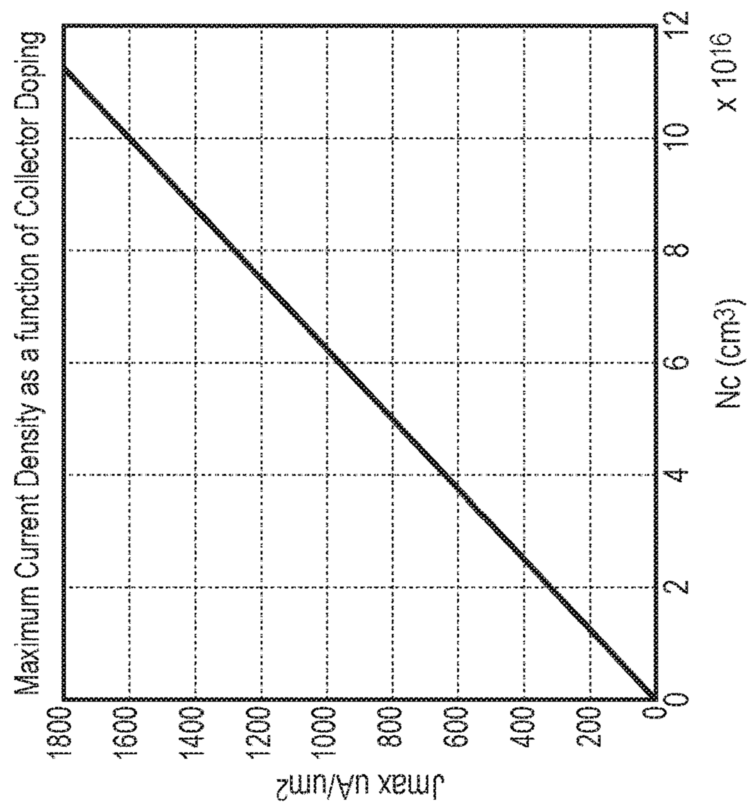
FIG. 25A shows current density versus doping density.

FIGS. 25A and 25B put equations 1 to 7 into context for a device where a is equal to 0.5 microns. However it should be appreciated that other widths of device can be used. The device width and channel doping can be varied, thus a much wider device (say 4 microns) could be arranged to cut off at around 30V with a dopant concentration reduced to $1\times10^{16}$ $cm^{-3}$.

FIG. 25A shows that from a current density perspective, more doping is good but FIG. 25B shows that from a pinch off and breakdown perspective less doping is preferred. However the doping level can be selected to arrive at a pinch off voltage that has a sufficient safety margin over the bipolar transistor breakdown voltage to account for process variations while still providing a good current density. That said, the carrier flow path has, in simulation, been related to the emitter area and hence current density can be traded for higher current carrying capability of the device as a whole by increasing the emitter size, for example by increasing the emitter length along the direction y-y in FIG. 19.

In the Figures the regions 1112 and 1116 are shown as abutting the insulating walls of the trenches. This need not be the case and the highly doped regions 1112 and 1116 may be situated away from the insulating walls of the trench (which may facilitate making metal contacts with them to contact with the P+ regions 111) when a less doped N type region can extend to the trench wall from regions 1112 and 1116.

Figure 26:
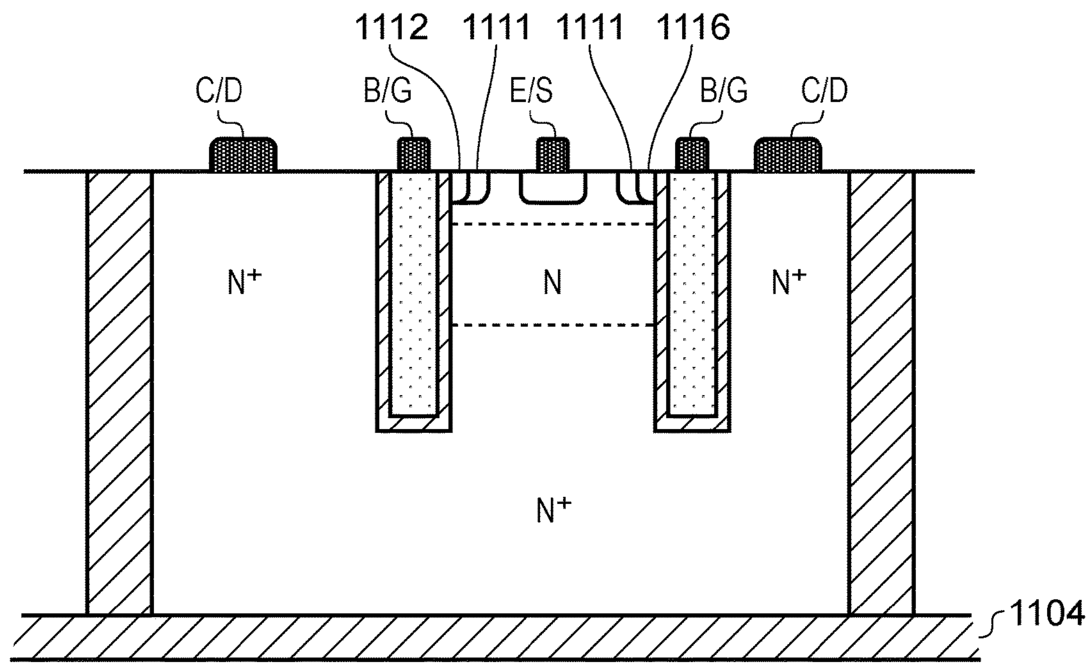
FIG. 26 is a cross section through a further embodiment of a power switch.

In the embodiments shown, the trenches that surround the emitter and base have served to define the isolated tub that isolates the current control device of this disclosure from other devices in the wafer. However this need not be the case and the trenches that define the gate may be different from the trenches that define the isolated tub, as shown in FIG. 26, where the trenches defining the gate extend into the N+ layer but not to the bottom most insulating layer 1104.

The formation of the relatively smaller drive FET, with its smaller gate in the insulating well means that the parasitic gate capacitance associated with the drive FET should be much smaller than that of a conventional IGBT. As a result transient current flows, i.e. inrush currents, at switching can be much reduced and it becomes easier and less power consuming to drive the device between conducting and non-conducting states.

Figure 27:
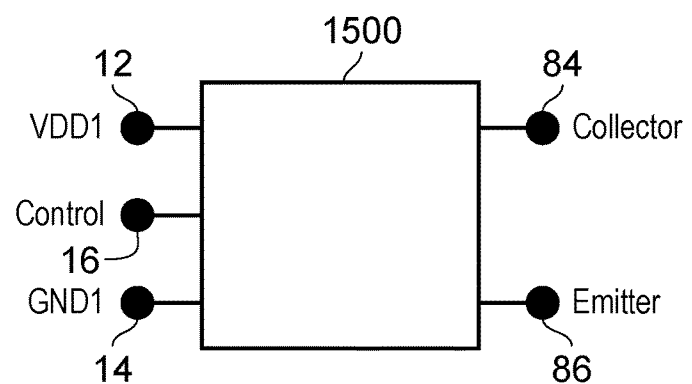
FIG. 27 shows an encapsulated device embodying the combined isolator and power switch.

FIG. 27 schematically illustrates an encapsulated five terminal isolator and power switch constituting an embodiment of the present disclosure. In essence the circuit shown in FIG. 1, together with the power switch implemented using the transistor designs disclosed hereinbefore are encapsulated within a package 1500, together with suitable heat sinking. The package has five active terminals corresponding to terminals 12, 14, 16, 84 and 86 described with respect to FIG. 1.

Figure 28:
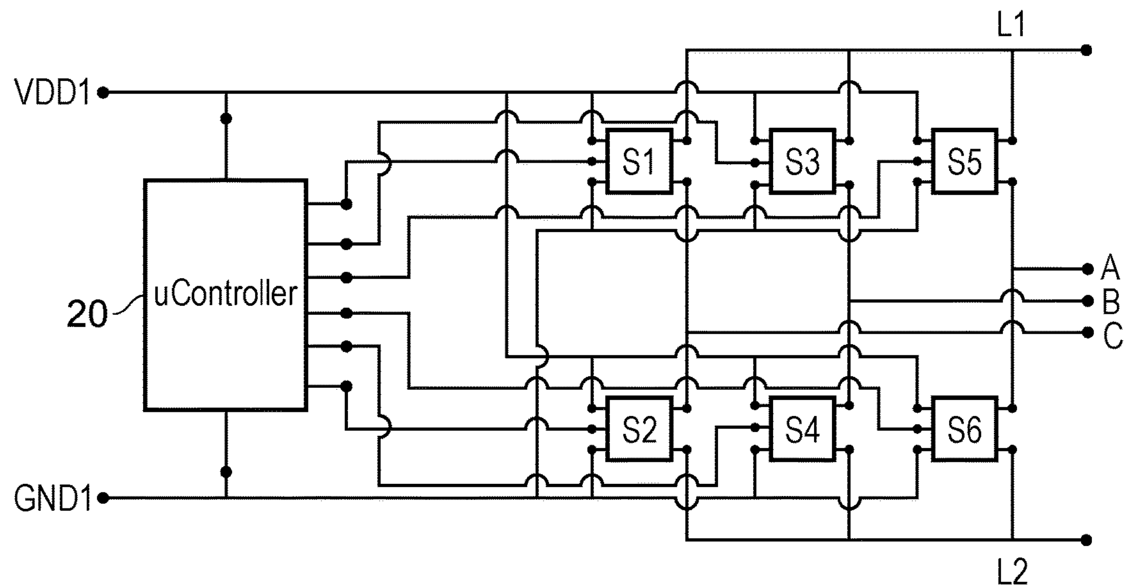
FIG. 28 shows a DC to 3-phase AC converter using embodiments of the present disclosure.

FIG. 28 illustrates the three phase DC to AC converter where high voltage DC voltages on line L1 and L2 representing the link voltage lines can be provided to respective output terminals A, B and C representing the three phases for an AC supply. Each conversion is done by a pair of switches. Thus switches S1 and S2 are formed using the combined isolator and switch arrangements described herein are in series connection between L1 and L2 and the node between them is connected to the phase C output. Switches S3 and S4 are in series connection between L1 and L2 and the node between them is connected to phase B output, and switches S5 and S6 are in series connection between L1 and L2 and the node between them forms the A-phase output. Each of the individual switches S1 to S6 receives an input from the microcontroller, together with low voltage supplies of Vdd1 and ground1.

If the heat dissipation specifications can be met, multiple switches and isolators can be provided within a single package. Thus the lines Vdd1 and ground could be shared between multiple isolator and switch combinations.

Figure 29:
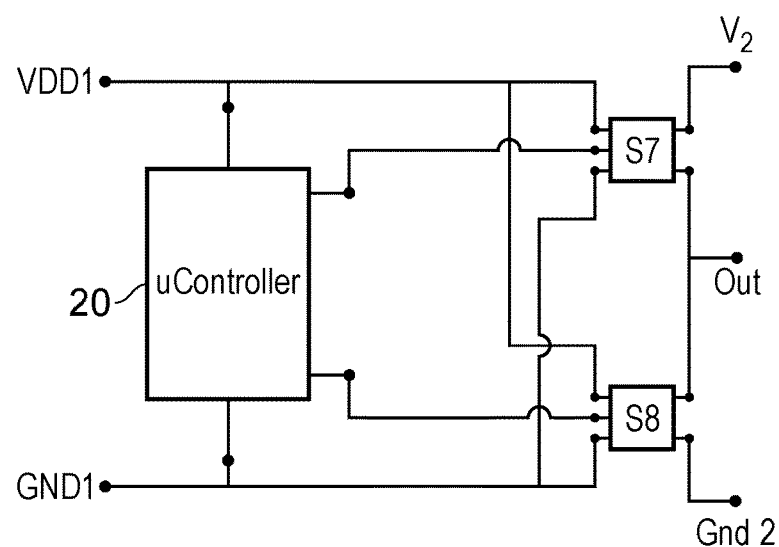
FIG. 29 shows a half bridge formed using combined isolators and power switches.

FIG. 29 shows two switches, S7 and S8 responsive to a microcontroller to control the voltage at an output node OUT to either be connected to V2 or to ground. This arrangement forms a suitable half bridge configuration for unidirectional motor control.

Figure 30:
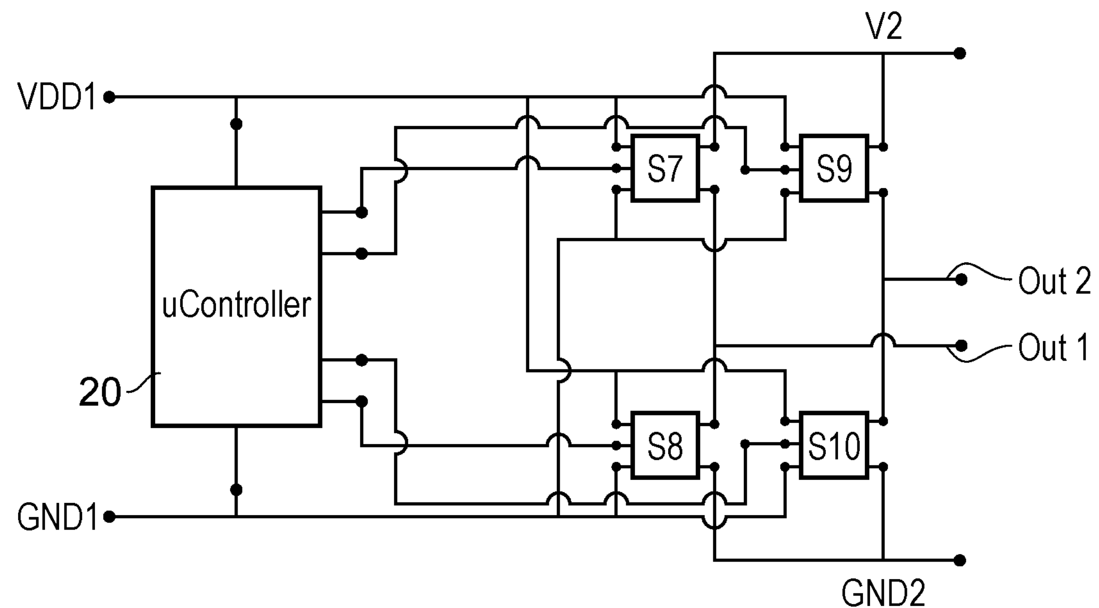
FIG. 30 shows combined isolators and power switches used to form an H bridge drive circuit.

The arrangement shown in FIG. 29 can be extended, as shown in FIG. 30, by the addition of two additional switches S9 and S10 connected between V2 and ground 2 such that either output node OUT1 and OUT2 can be connected to V2 or ground 2. This arrangement provides a bidirectional motor controller enabling both speed control and fly back (circulating) current control can be achieved.

Figure 31:
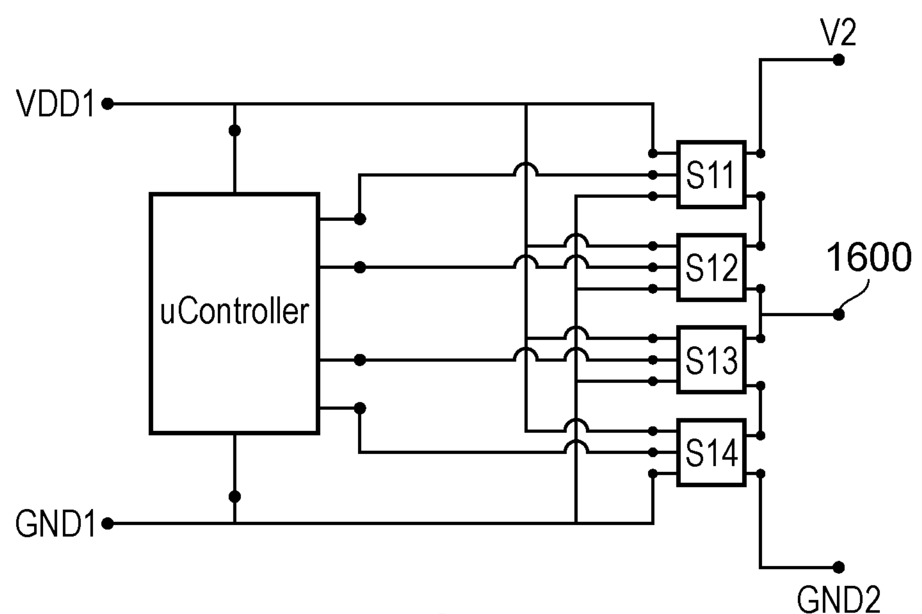
FIG. 31 shows a three level neutral point clamp formed using combined isolators and power switches.
Figure 32:
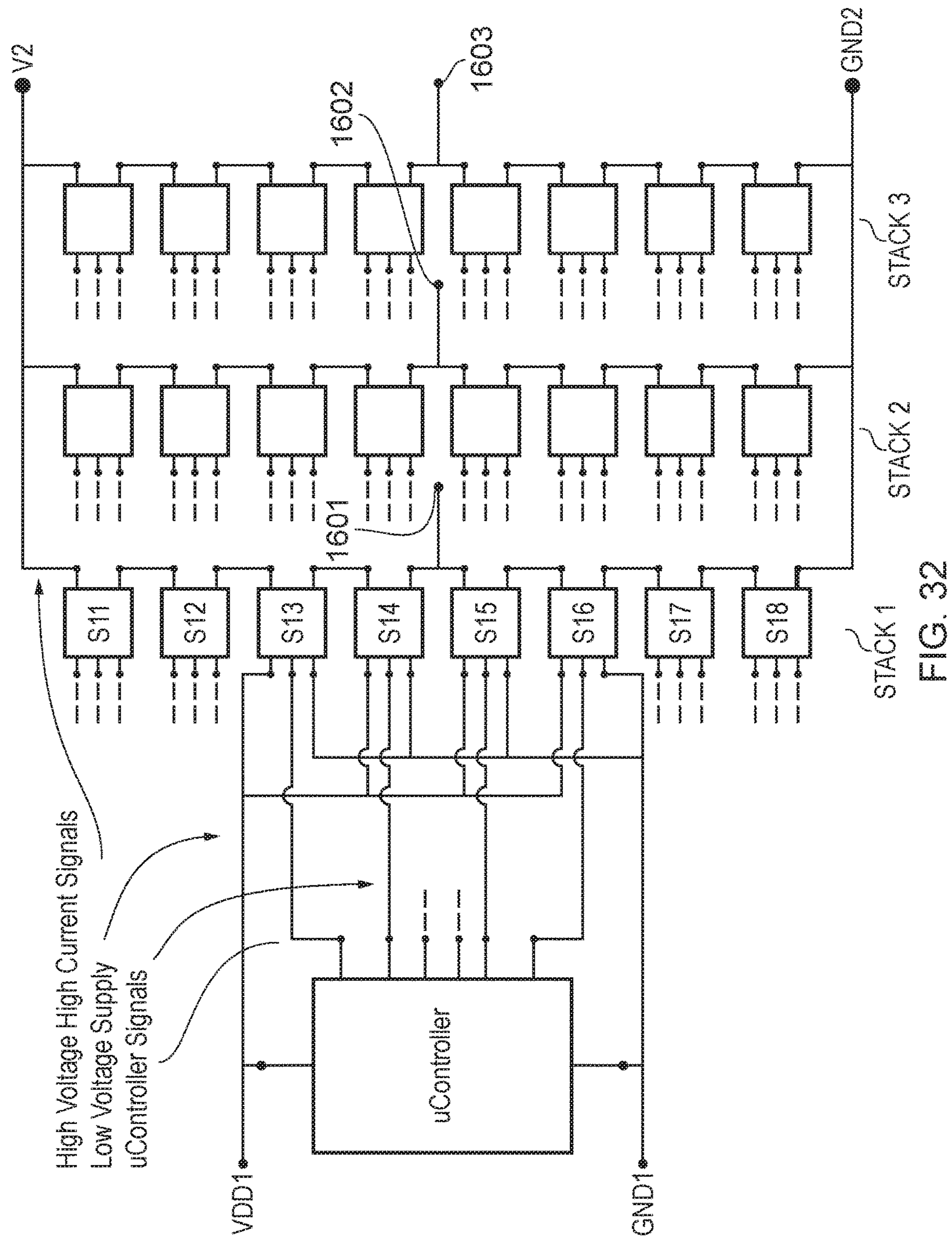
FIG. 32 show a variation of the circuit shown in FIG. 31.

FIGS. 31 and 32 show configurations where multiple switches S11 to S14 in FIG. 31 and S11 to S18 in FIG. 32 can be arranged in stacked configuration with a midpoint of the stack forming an output of the stack. Furthermore, as shown in FIG. 32, multiple stacks designated stack1, stack2 and stack3 can be provided. The stacks of switches are useful for forming multilevel DC to AC converters. The three level neutral point clamped converter technology is widely used. The arrangement shown in FIG. 31 can provide a single phase conversion whereas the arrangement shown in FIG. 32 can provide a three phase conversion. Each of the circuits shown in FIG. 31 or 32 can act either as an AC to DC converter or a DC to AC converter. Thus two copies of the circuit shown in FIG. 31 might be combined together such that an incoming single phase AC signal at node 1600 can be converted to a DC link voltage by one version of the circuit shown in FIG. 31, and then the DC link voltage is converted by another version of it to another AC signal at suitable frequency and voltage. Similarly the arrangement shown in FIG. 32 can be used to provide multiphase conversion such that multiple phases on inputs 1601, 1602 and 1603 can be converted to a DC link voltage V2 by an AC-DC converter and subsequently the DC link voltage can be received by a further copy of the circuit and converted to 3 phase AC at a different frequency or voltage, an output on the nodes 1601, 1602 and 1603 of the second copy of the circuit shown in FIG. 32. The use of multilevel converters can provide significant improvements over standard two level converters. One advantage is that the power switches and DC link capacitors used in, for example, three-level neutral point clamped converters, only have to withstand half of the DC link voltage so the converter can deal with double voltage values and hence double power output. Furthermore, the output voltage spectrum is improved. The downside with such increased complexity however is that the switching complexity and timing control is made more difficult. However the combined isolator and power switch described herein is easy to drive, is fast and is eminently suited for use in multipoint inverters.

In summary, a series connected FET is provided to protect a bipolar transistor from excessive voltage, but the bipolar transistor can be used to inject carriers through the channel of the pinched off FET, so as to turn it on. This can allow a higher gain bipolar transistor to be used. The bipolar transistor by virtue of its higher gain consumes less gate current for a given device current and hence devices driving the bipolar transistor can supply less current. This allows a smaller drive FET to be used, resulting in reduced gate capacitance. This allows the device to be controlled with a control signal powered by a micro-transformer, and the system can be provided in an integrated circuit (chip scale) package. In an embodiment, a combined isolator and power switch includes a power switch including a bipolar transistor in series with a field effect transistor, in which the bipolar transistor and the field effect transistor share a region of semiconductor such that the field effect transistor serves to limit a voltage across an active region of the bipolar transistor with gains in excess of 10 while still providing a breakdown voltage in excess of 800 V.

The dopings of the semiconductor regions in the embodiments discussed above can be reversed between P type and N type to form a higher gain PNP transistor in conjunction with a JFET. The transistor device has been drawn with a couple of configurations in plan view but other shapes (linear, race track, etc.) are also possible to implement in accordance with any of the principles and advantages discussed herein.

Aspects of this disclosure can be implemented in various electronic devices. For instance, any of the devices discussed herein can be implemented in an electronic device with a need to switch a high voltage. Such a high voltage can be at least about 100 Volts or at least about 200 Volts. In certain embodiments, the devices discussed herein can be particularly advantageous in electronic devices that switch a high voltage of at least about 1000 Volts or at least about 1200 Volts. Examples of the electronic devices can include, but are not limited to, consumer electronic products, parts of the electronic products such as packaged switch components, electronic test equipment, cellular communications infrastructure, etc. Examples of the electronic devices can include, but are not limited to, motor controllers, inverters, precision instruments, medical devices, wireless devices, appliances, vehicular electronics systems, etc. Further, the electronic devices can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description of Certain Embodiments using the singular or plural number may also include the plural or singular number respectively. Where the context permits, the word "or" in reference to a list of two or more items is intended to cover all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features and/or elements. Thus, such conditional language is not generally intended to imply that features and/or elements are in any way required for one or more embodiments or that one or more embodiments necessarily include such features and/or elements.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and devices described herein may be made without departing from the spirit of the disclosure. For example, while devices are presented in a given arrangement, alternative embodiments may perform similar functionalities with different structures, and some portions of a given device may be deleted, moved, added, subdivided, combined, and/or modified. Any suitable combination of the elements and acts of the various embodiments described above can be combined to provide further embodiments. Indeed, any of the principles and advantages discussed with reference with any of the embodiments disclosed herein can be applied in connection with any other suitable features discussed herein. The accompanying claims and their equivalents are intended to cover such forms or modifications as would fall within the scope and spirit of the disclosure.

The claims presented herein are in single dependency format suitable for use at the USPTO, however, it should be assumed that each claim is intended to depend on any preceding claim of the same type except where that is clearly not possible.

What is claimed is:

1. A combined isolator and power switch, comprising:

a semiconductor power switch comprising a bipolar transistor in series combination with a field effect transistor;

an isolator operatively connected to the semiconductor power switch and arranged to control the semiconductor power switch based on a switch control signal; and an integrated circuit package encapsulating the semiconductor power switch and the isolator and comprising a first terminal coupled to the isolator and configured to receive a supply voltage, a second terminal coupled to the isolator and configured to receive the switch control signal, a third terminal coupled to the semiconductor power switch, and a fourth terminal coupled to the semiconductor power switch.

2. The combined isolator and power switch as claimed in claim 1, wherein a first region of semiconductor is shared by the bipolar transistor and the field effect transistor.

3. The combined isolator and power switch as claimed in claim 1, wherein the isolator and the semiconductor power switch are packaged as a device having five active terminals.

4. The combined isolator and power switch as claimed in claim 1, wherein the isolator comprises a micro-transformer configured to transmit data between first and second voltage domains.

5. The combined isolator and power switch as claimed in claim 4, wherein the micro-transformer is configured to provide the data pulses representing edge transitions of an input signal.

6. The combined isolator and power switch as claimed in claim 1, wherein the isolator is a first isolator, and wherein the combined isolator and power switch further comprises a second isolator arranged as a micro transformer coupled to a direct current (DC) to alternating current (AC) converter and an AC to DC converter arranged to deliver power from a first voltage domain to a receiver and switch driver in a second voltage domain, wherein the first isolator is configured to transfer the switch control signal from the first voltage domain to the second voltage domain.

7. The combined isolator and power switch as claimed in claim 1, wherein the semiconductor power switch is formed vertically within a semiconductor substrate.

8. The combined isolator and power switch as claimed in claim 1, wherein the semiconductor power switch comprises a drive field effect transistor having a gate formed within a vertically extending channel.

9. The combined isolator and power switch as claimed in claim 1, wherein the field effect transistor is a junction field effect transistor that has a channel formed between insulated gate electrodes, and wherein a pinch off voltage of the field effect transistor is based on a distance between the insulated gate electrodes.

10. The combined isolator and power switch as claimed in claim 1, wherein the field effect transistor is formed between regions of an opposing type of semiconductor material to that of a collector region of the bipolar transistor.

11. The combined isolator and power switch as claimed in claim 1, wherein the isolator is a first isolator, wherein the combined isolator and power switch further comprises a power transfer circuit that comprises a second isolator, wherein the power transfer circuit is configured to transfer power from a first voltage domain to a second voltage domain, and wherein the first isolator is configured to transfer the switch control signal from the first voltage domain to the second voltage domain.

12. The combined isolator and power switch as claimed in claim 1, wherein the bipolar transistor and the field effect transistor are arranged such that the field effect transistor serves to limit a voltage across an active region of the bipolar transistor with gains in excess of 10 while still providing a breakdown voltage in excess of 800 Volts.

13. A combined isolator and power switch comprising:

a first isolator configured to transmit data from a first voltage domain to a second voltage domain;

a semiconductor power switch operatively coupled to the first isolator and configured to receive a control signal in the second voltage domain;

a power transfer circuit comprising a second isolator, the power transfer circuit configured to transfer power from the first voltage domain to the second voltage domain and provide power to at least part of the first isolator in the second voltage domain; and a package encapsulating the semiconductor power switch, the first isolator, and the second isolator.

14. The combined isolator and power switch as claimed in claim 13, further comprising a receiver and switch driver coupled between the first isolator and the semiconductor power switch, wherein the semiconductor power switch is configured to receive the control signal by way of the receiver and switch driver, and wherein the power transfer circuit is configured to provide direct current power to the receiver and switch driver.

15. The combined isolator and power switch as claimed in claim 13, wherein the second isolator comprises a transformer, and wherein the transformer comprises a coil formed by a conductor disposed on or within a semiconductor substrate.

16. The combined isolator and power switch as claimed in claim 13, wherein the second isolator is coupled to a direct current (DC) to alternating current (AC) converter in the first voltage domain and coupled to an AC to DC converter in the second voltage domain.

17. The combined isolator and power switch as claimed in claim 13, wherein the power switch comprises a junction field effect transistor in series with a bipolar transistor.

18. The combined isolator and power switch as claimed in claim 17, wherein the power switch further comprises a drive field effect transistor coupled to the bipolar transistor, the drive field effect transistor comprising an insulated gate.

19. A combined isolator and switch comprising:

a power switch packaged within an integrated circuit package, the power switch comprising a bipolar transistor in series with a junction field effect transistor, the junction field effect transistor comprising a gate conductor disposed between insulating walls and a buried region of doped semiconductor that is in contact with the gate conductor; and an isolator packaged within the integrated circuit package and configured to provide a control signal to the power switch.

20. The combined isolator and power switch as claimed in claim 19, wherein the power switch and at least a portion of the isolator are on a common semiconductor die.

21. A combined isolator and switch, comprising:

a semiconductor power switch comprising a bipolar transistor in series with a junction field effect transistor, the junction field effect transistor comprising a gate conductor disposed between insulating walls and a buried region of doped semiconductor that is in contact with the gate conductor;

an isolator operatively connected to the semiconductor power switch and configured to provide a control signal to the semiconductor power switch; and an integrated circuit package encapsulating the semiconductor power switch and the isolator.

* * * * *